(12) United States Patent
Hong

(10) Patent No.: US 12,399,213 B2
(45) Date of Patent: Aug. 26, 2025

(54) SEMICONDUCTOR DEVICE HAVING DEFECT DETECTION CIRCUIT

(71) Applicant: SK hynix Inc., Icheon-si Gyeonggi-do (KR)

(72) Inventor: Young Ock Hong, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 224 days.

(21) Appl. No.: 18/315,432

(22) Filed: May 10, 2023

(65) Prior Publication Data

US 2024/0159823 A1    May 16, 2024

(30) Foreign Application Priority Data

Nov. 10, 2022  (KR) .......................... 10-2022-0149871

(51) Int. Cl.
*G01R 31/28* (2006.01)
*H01L 23/00* (2006.01)
(Continued)

(52) U.S. Cl.
CPC ...... *G01R 31/2884* (2013.01); *H01L 23/5226* (2013.01); *H01L 23/528* (2013.01); *H01L 24/08* (2013.01); *H01L 24/80* (2013.01); *H01L 25/0657* (2013.01); *H10B 80/00* (2023.02); *H01L 2224/08145* (2013.01); *H01L 2224/80895* (2013.01); *H01L 2225/06565* (2013.01); *H01L 2924/1437* (2013.01)

(58) Field of Classification Search
CPC ............ G01R 31/2884; H01L 23/5226; H01L 23/528; H01L 24/08; H01L 24/80; H01L 25/0657; H01L 2224/08145; H01L 2224/80895; H01L 2225/06565; H01L 2924/1437; H01L 22/34; H01L 25/18; H01L 22/32; H01L 23/5283; H01L 24/09; H01L 2224/08123; H01L 2224/091; H01L 2225/06513; H01L 2225/06527; H10B 80/00; H10B 43/27; H10B 43/40; H10B 41/27; H10B 41/40; H10B 41/50; H10B 43/50

USPC ...................................... 324/750.3, 537, 500
See application file for complete search history.

(56) References Cited

U.S. PATENT DOCUMENTS

| | | | |
|---|---|---|---|
| 2015/0279888 A1* | 10/2015 | Chen | H10F 39/809 257/459 |
| 2020/0135594 A1* | 4/2020 | Lee | H01L 24/92 |
| 2025/0006676 A1* | 1/2025 | Seol | H01L 24/05 |

FOREIGN PATENT DOCUMENTS

| | | |
|---|---|---|
| KR | 1020220005200 A | 1/2022 |
| KR | 102360381 B1 | 2/2022 |

* cited by examiner

*Primary Examiner* — Giovanni Astacio-Oquendo
(74) *Attorney, Agent, or Firm* — WILLIAM PARK & ASSOCIATES LTD.

(57) ABSTRACT

There is provided a semiconductor device having a defect detection circuit. The semiconductor device includes a plurality of upper bonding pads, a plurality of lower bonding pads adhered to the plurality of upper bonding pads, a first upper line electrically connecting upper bonding pads, among the plurality of upper bonding pads, to each other; a plurality of lower lines electrically connected to the plurality of lower bonding pads; and a first defect detection circuit including an input terminal connected to a lower line, among the plurality of lower lines and an output terminal connected to another lower line, among the plurality of lower lines.

17 Claims, 13 Drawing Sheets

(51) Int. Cl.
    *H01L 23/522*     (2006.01)
    *H01L 23/528*     (2006.01)
    *H01L 25/065*     (2023.01)
    *H10B 80/00*     (2023.01)

SEMICONDUCTOR DEVICE HAVING DEFECT DETECTION CIRCUIT

CROSS-REFERENCE TO RELATED APPLICATION

The present application claims priority under 35 U.S.C. § 119(a) to Korean patent application number 10-2022-0149871, filed on Nov. 10, 2022, in the Korean Intellectual Property Office, the entire disclosure of which is incorporated herein by reference.

BACKGROUND

1. Technical Field

The present disclosure generally relates to a semiconductor device, and more particularly, to a semiconductor device having a defect detection circuit.

2. Related Art

In general, a semiconductor device is formed with a repeated pattern on a wafer made of a semiconductor material. The wafer is cut into a large number of individual semiconductor dies, and each of the cut semiconductor dies is packaged into a semiconductor device. While such cutting and packaging processes are performed, cracks may occur in the semiconductor device. A means for preventing the release of defective products by precisely detecting such cracks is required.

SUMMARY

In accordance with an aspect of the present disclosure, there is provided a semiconductor device including: a plurality of upper bonding pads; a plurality of lower bonding pads adhered to the plurality of upper bonding pads; a first upper line electrically connecting upper bonding pads, among the plurality of upper bonding pads, to each other; a plurality of lower lines electrically connected to the plurality of lower bonding pads; and a first defect detection circuit including an input terminal connected to a lower line, among the plurality of lower lines, and an output terminal connected to another lower line, among the plurality of lower lines.

In accordance with another aspect of the present disclosure, there is provided a semiconductor device including: a plurality of upper bonding pads; a plurality of lower bonding pads adhered to the plurality of upper bonding pads; a first upper line electrically connecting upper bonding pads, among the plurality of upper bonding pads, to each other; a gate stack structure formed above the first upper line; a plurality of second upper lines disposed above the gate stack structure; a first upper contact extending in a vertical direction in the gate stack structure to connect the first upper line to a second upper line, among the plurality of second upper lines; a plurality of lower lines electrically connected to the plurality of lower bonding pads; and a defect detection circuit including an output terminal connected to a lower line, among the plurality of lower lines.

In accordance with still another aspect of the present disclosure, there is provided a semiconductor device including: a plurality of upper bonding pads; a plurality of lower bonding pads adhered to the plurality of upper bonding pads; a plurality of first upper lines electrically connected to the plurality of upper bonding pads; a first lower line electrically connecting the plurality of lower bonding pads to each other; and a first defect detection circuit including an input terminal connected to a first upper line, among the plurality of first upper lines, and an output terminal connected to another first upper line, among the plurality of first upper lines.

In accordance with still another aspect of the present disclosure, there is provided a semiconductor device including: a plurality of upper bonding pads; a plurality of lower bonding pads adhered to the plurality of upper bonding pads; a plurality of first upper lines electrically connected to the plurality of upper bonding pads; a gate stack structure formed above the plurality of first upper lines; a plurality of second upper lines disposed above the gate stack structure; a first upper contact extending in a vertical direction in the gate stack structure to connect a first upper line, among the plurality of first upper lines, to a second upper line, among the plurality of second upper lines; a first lower line electrically connecting the plurality of lower bonding pads to each other; and a defect detection circuit including an input terminal connected to another second upper line, among the plurality of second upper lines.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms and cannot be construed as limited to the embodiments set forth herein.

Hereinafter, exemplary embodiments of the present disclosure will be described in detail with reference to the accompanying drawings in order for those skilled in the art to be able to readily implement the technical spirit of the present disclosure.

Embodiments provide a semiconductor device having a defect detection circuit, which can detect a defect due to a bonding process in a semiconductor device formed using a wafer bonding technique.

Figure 1:
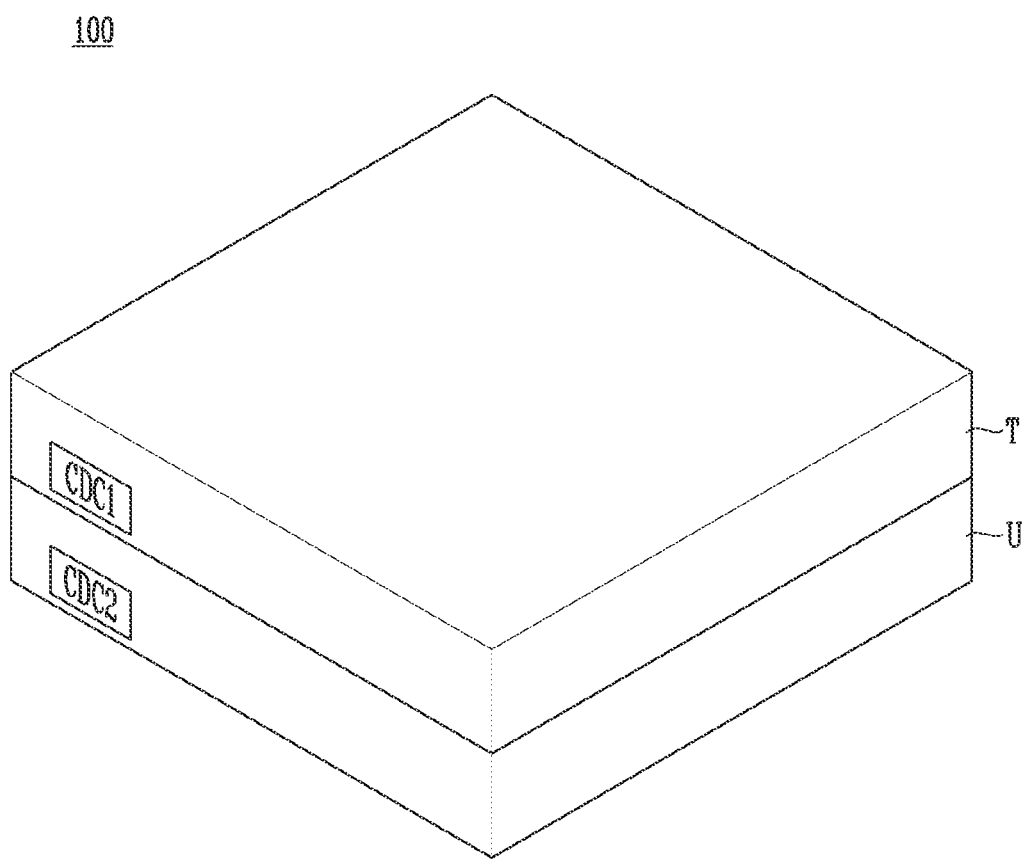
FIG. 1 is a perspective view briefly illustrating a semiconductor device in accordance with an embodiment of the present disclosure.

FIG. 1 is a perspective view briefly illustrating a semiconductor device in accordance with an embodiment of the present disclosure.

Referring to FIG. 1, the semiconductor device 100 may include a lower structure U and an upper structure T. The upper structure T may be disposed on the lower structure U, and the lower structure U and the upper structure T may have a structure in which the lower structure U and the upper structure T are adhered to each other through a bonding process.

The upper structure T may include a first defect detection circuit CDC1, and the lower structure U may include a second defect detection circuit CDC2.

The first defect detection circuit CDC1 may include an input terminal and an output terminal, which are connected to lines in the upper structure T. The first defect detection circuit CDC1 may supply a test current to the lines in the upper structure T through the input terminal in a test operation and may detect a current received through the output terminal, thereby detecting a defect of the lines in the upper structure T. The first defect detection circuit CDC1 may be connected to a test apparatus that is outside of the semiconductor device 100.

The second defect detection circuit CDC2 may include an input terminal and an output terminal, which are connected to lines in the lower structure U. The second defect detection circuit CDC2 may supply a test current to the lines in the lower structure U through the input terminal in a test operation and may detect a current received through the output terminal, thereby detecting a defect of the lines in the lower structure U. The second defect detection circuit CDC2 may be connected to a test apparatus that is outside of the semiconductor device 100.

The first defect detection circuit CDC1 or the second defect detection circuit CDC2 may be connected to bonding lines connecting the lower structure U to the upper structure T, supply a test current to the bonding lines through the input terminal in a test operation, and detect a current received through the output terminal, thereby detecting a defect of the bonding lines.

Although a case where the upper structure T includes one first defect detection circuit CDC1 and the lower structure U includes one second defect detection circuit CDC2 has been described in the embodiment of the present disclosure, the present disclosure is not limited thereto. In a modified example, each of the upper structure T and the lower structure U may include a plurality of defect detection circuits. For example, the upper structure T or the lower structure U may include a third defect detection circuit, and the third defect detection circuit may supply a test current to the bonding lines through an input terminal, and detect a current received through an output terminal, thereby detecting a defect of the bonding lines.

For example, the semiconductor device 100 may be a memory device. The semiconductor device 100 may be a memory integrated circuit including a peripheral circuit including a row decoder, a control circuit, a page buffer group, and the like, a memory cell array, and a plurality of defect detection circuits. Meanwhile, a case where the semiconductor device 100 is a memory device has been described in this embodiment, the present disclosure is not limited thereto. In a modified example, the semiconductor device 100 may be a Central Processing Unit (CPU), a Graphics Processing Unit (GPU), or an Application Processor (AP).

Figure 2:
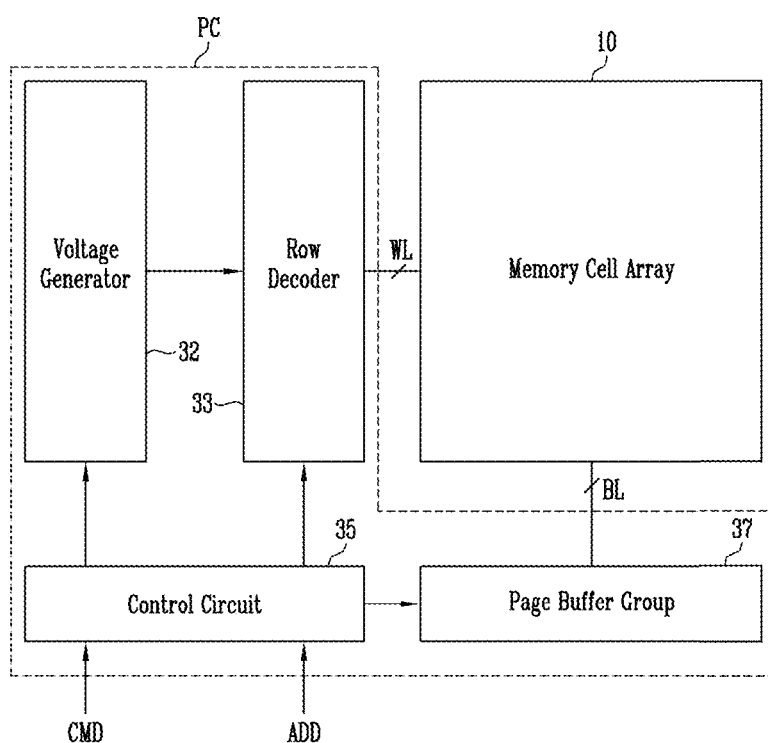
FIG. 2 is a block diagram illustrating a semiconductor device in accordance with an embodiment of the present disclosure.

FIG. 2 is a block diagram illustrating a semiconductor device in accordance with an embodiment of the present disclosure.

Referring to FIG. 2, the semiconductor device 100 includes a peripheral circuit PC and a memory cell array 10. The semiconductor device 100 may further include a plurality of defect detection circuits (CDC1 and CDC2, shown in FIG. 1).

The peripheral circuit PC may be configured to perform a program operation for storing data in the memory cell array 10, a read operation for outputting data stored in the memory cell array 10, and an erase operation for erasing data stored in the memory cell array 10.

In an embodiment, the peripheral circuit PC may include a voltage generator 32, a row decoder 33, a control circuit 35, and a page buffer group 37.

The memory cell array 10 may include a plurality of memory blocks. The memory cell array 10 may be connected to the row decoder 33 through word lines WL, and be connected to the page buffer group 37 through bit lines BL.

The control circuit 35 may control the voltage generator 32, the row decoder 33, and the page buffer group 37 in response to a command CMD and an address ADD.

The voltage generator 32 may generate various operating voltages including an erase voltage, a ground voltage, a program voltage, a verify voltage, a pass voltage, a read voltage, and the like, which are used for a program operation, a read operation, and an erase operation, under the control of the control circuit 35.

The row decoder 33 may select a memory block under the control of the control circuit 35. The row decoder 33 may be configured to apply operating voltages to word lines WL connected to the selected memory block.

The page buffer group 37 may be connected to the memory cell array 10 through the bit lines BL. The page buffer group 37 may temporarily store data received from an input/output circuit (not shown) in a program operation under the control of the control circuit 35. The page buffer group 37 may sense voltages or currents of the bit lines BL in a read operation or a verify operation under the control of the control circuit 35. The page buffer group 37 may select bit lines BL under the control of the control circuit 35.

Structurally, the memory cell array 10 may overlap with a portion of the peripheral circuit PC.

Figure 3:
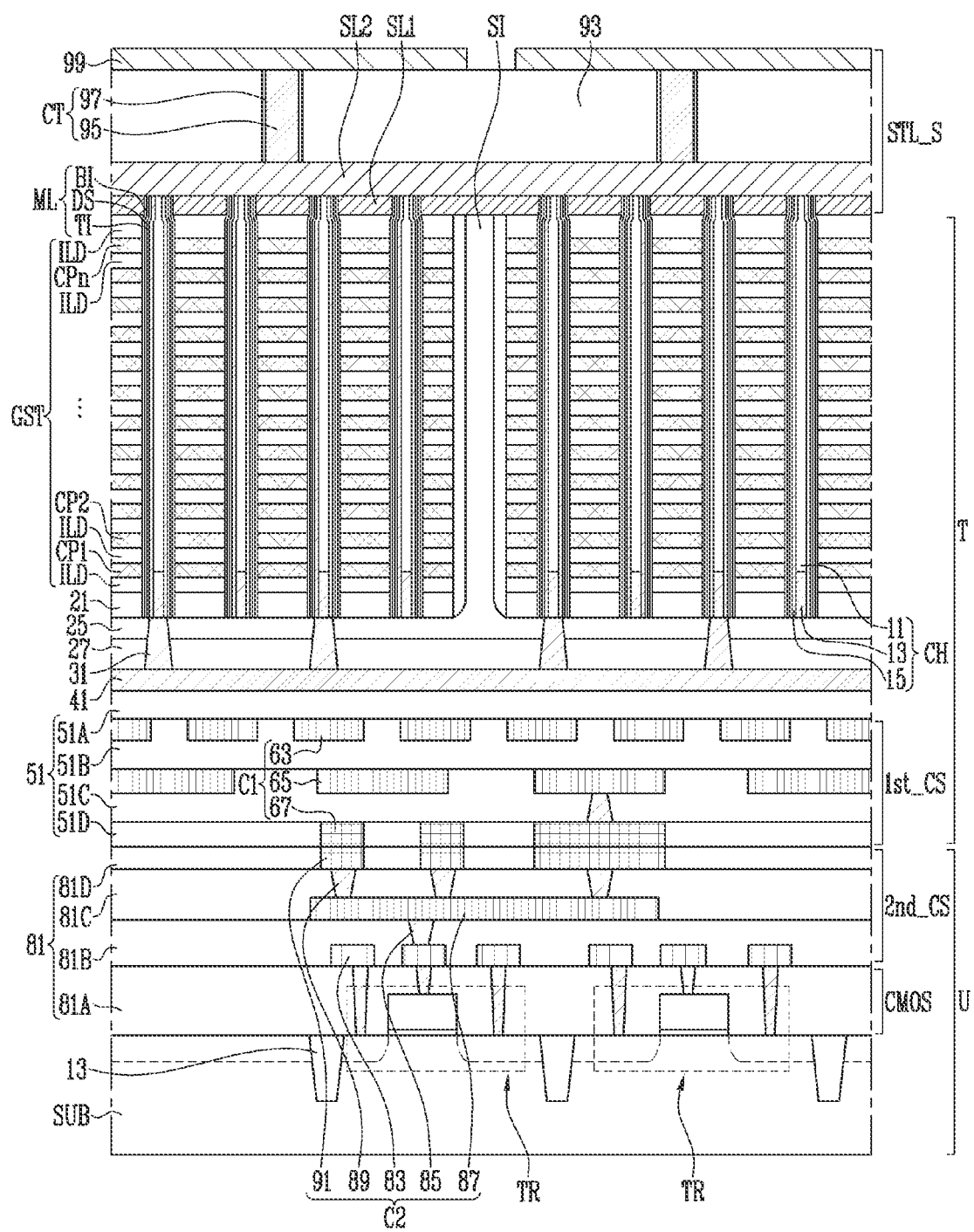
FIG. 3 is a sectional view illustrating a memory cell array shown in FIG. 2.

FIG. 3 is a sectional view illustrating the memory cell array shown in FIG. 2.

Referring to FIG. 3, the memory cell array may be disposed as a lower structure U and an upper structure T that are adhered to each other.

The upper structure T may include a gate stack structure GST that is isolated from each other by a slit SI, channel structures CH penetrating the gate stack structures GST, a memory layer ML extending along a sidewall of each of the channel structures CH, a bit line 41 and a first connection structure C1, which are disposed under the gate stack structure GST, and a string line structure STL_S disposed above the gate stack structure GST.

The gate stack structure GST may include interlayer insulating layers ILD and conductive patterns CP1 to CPn, which are alternately stacked in a vertical direction. Each of the conductive patterns CP1 to CPn may include various conductive materials including a doped silicon layer, a metal layer, a metal silicide layer, a barrier layer, and the like, and include two kinds of conductive materials. For example, each of the conductive patterns CP1 to CPn may include tungsten and a titanium nitride layer (TiN) surrounding a surface of the tungsten. The tungsten may be a low-resistance metal and may reduce a resistance of the conductive patterns CP1 to CPn. The titanium nitride layer (TiN) may be a barrier layer and may prevent a direct contact between the tungsten and the interlayer insulating layers ILD.

A first conductive pattern CP1 that is adjacent to the bit line 41 among the conductive patterns CP1 to CPn may be used as a drain select line DSL. In another embodiment, at least two conductive patterns that are adjacent to the bit line 41 and are consecutively stacked may be used as drain select lines. An nth conductive pattern CPn that is adjacent to first and second source layers SL1 and SL2, among the conductive patterns CP1 to CPn, may be used as a source select line SSL. In another embodiment, at least two conductive patterns that are adjacent to the first and second source layers SL1 and SL2 and are consecutively stacked may be used as source select lines. Conductive patterns (e.g., CP2 to CPn–1), which are adjacent to each other in the vertical direction and are disposed between the drain select line and the source select line, may be used as the word lines WL described above with reference to FIG. 2.

The channel structure CH may penetrate the gate stack structure GST in the vertical direction, and one end portion of the channel structure CH may be formed to protrude farther than the gate stack structure GST. The channel structure CH may be formed of a hollow type. The channel structure CH may include a core insulating layer 11 filling a central region, a doped semiconductor layer 13 located at a bottom end portion of the core insulating layer 11, and a channel layer 15 surrounding surfaces of the core insulating layer 11 and the doped semiconductor layer 13. The channel layer 15 may be used as a channel region of a cell string corresponding thereto. The channel layer 15 may be formed of a semiconductor material. In an embodiment, the channel layer 15 may include a silicon layer. The channel structure CH may be formed to protrude farther than an interlayer insulating layer ILD disposed at an uppermost portion of the gate stack structure GST. An end portion of the protruding channel structure CH, i.e., the core insulating layer 11 and the channel layer 15 may be formed to be directly connected to the second source layer SL2 while penetrating the first source layer SL1. The core insulating layer 11 and the channel layer 15, which protrude farther than the gate stack structure GST, may have the same height.

The memory layer ML may be formed to surround a surface of the channel structure CH. The memory layer ML may include a tunnel insulating layer TI surrounding the channel layer 15 of the channel structure CH, a data storage layer DS surrounding the tunnel insulating layer TI, and a blocking insulating layer BI surrounding the data storage layer DS. The memory layer ML may be formed to protrude farther than the interlayer insulating layer ILD disposed at the uppermost portion of the gate stack structure GST. An end portion of the protruding memory layer ML may be formed to be in direct contact with the second source layer SL2 while penetrating the first source layer SL1. The core insulating layer 11, the channel layer 15, and the memory layer ML, which protrude farther than the gate stack structure GST, may have the same height. That is, the core insulating layer 11, the channel layer 15, and the memory layer ML, which protrude farther than the gate stack structure GST, may have a flat end portion. The memory layer ML may be defined as a component included in the channel structure CH.

The bit line 41 may be disposed under the gate stack structure GST. The bit line 41 may be connected to the channel structure CH through contact plugs 31 penetrating a plurality of insulating layers 21, 25, and 27. The bit line 41 may be spaced apart from a substrate SUB by a first insulating structure 51 and a second insulating structure 81.

A first connection structure 1st_CS may include the first insulating structure 51 and first connection structures C1 formed inside of the first insulating structure 51. The first connection structures C1 may include various conductive patterns 63, 65, and 67. The first insulating structure 51 may include at least two insulating layers 51A to 51D stacked between the bit line 41 and the second insulating structure 81.

The lower structure U may include a CMOS circuit structure CMOS including a plurality of transistors TR formed on the substrate and second connection structures 2nd_CS formed on the CMOS circuit structure CMOS.

The second connection structures 2nd_CS may include the second insulating structure 81 formed on the substrate SUB and second connection structures C2 formed inside of the second insulating structure 81. Each of the second connection structures C2 may include various conductive patterns 83, 85, 87, 89, and 91 buried inside of the second insulating structure 81. The second insulating structure 81 may include at least two insulating layers 81A to 81D which are sequentially stacked.

The upper structure T and the lower structure U may have a structure in which the upper structure T is adhered to the lower structure U through a bonding process. For example, exposed conductive patterns 67 of the first connection structure 1st_CS of the upper structure T may face and be adhered to exposed conductive patterns 91 of the second connection structure 2nd_CS of the lower structure U. The conductive patterns 67 and the conductive patterns 91 may be defined as a bonding metal.

The string line structure STL_S may be disposed above the gate stack structure GST and may include the first and second source layers SL1 and SL2 that are in contact with the channel structure CH protruding farther than the gate stack structure GST, an insulating layer 93, and an upper line 99, which are disposed on the top of the second source layer SL2. The string line structure STL_S may also include at least one contact plug CT for connecting the second source layer SL2 to the upper line 99 while penetrating the insulating layer 93.

The contact plug CT may include a contact conductive layer 95 and a diffusion preventing layer 97 surrounding a sidewall of the contact conductive layer 95. Each of the contact plugs CT may electrically connect one conductive layer 95 to one upper line 99.

Figure 4:
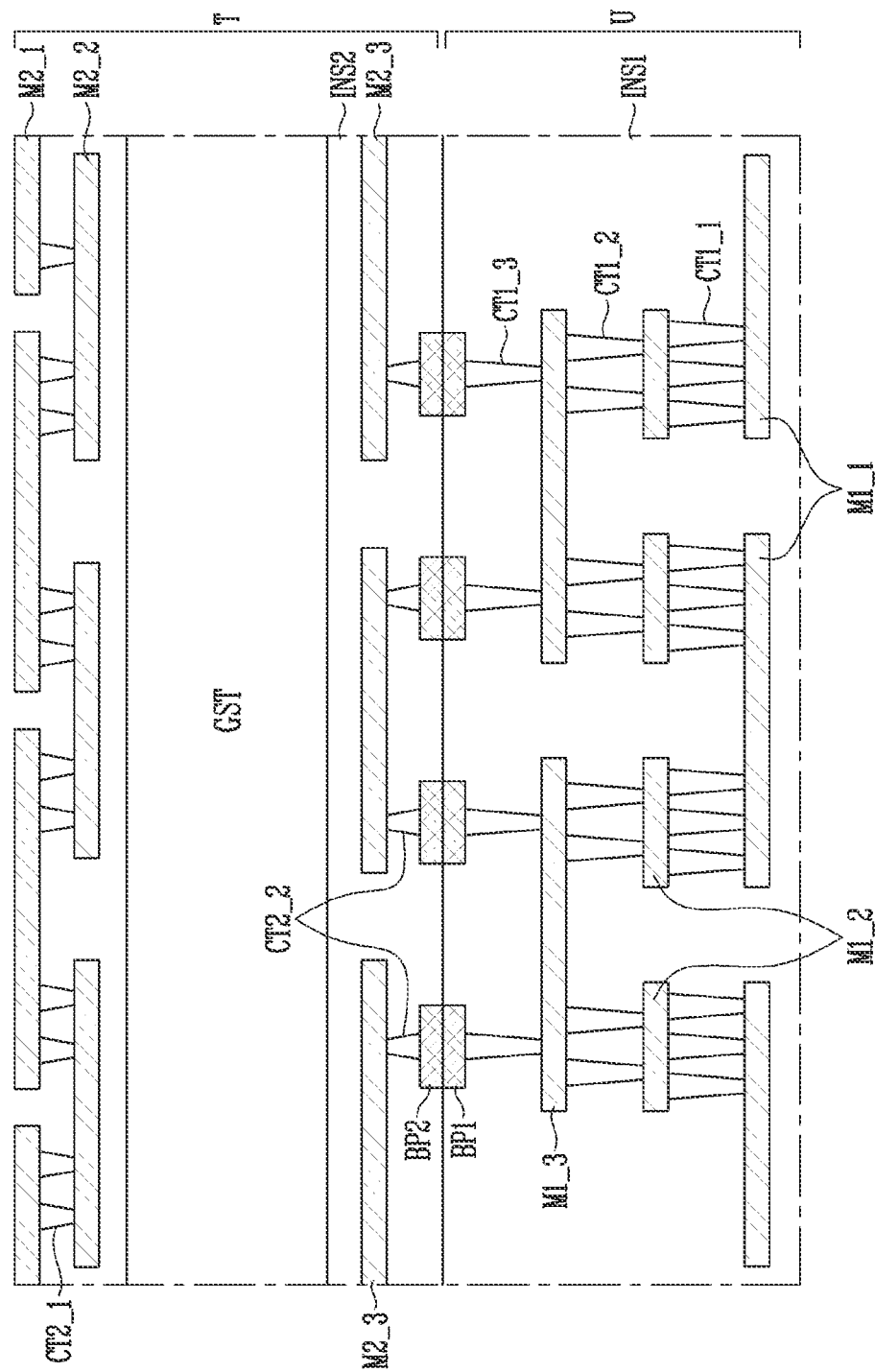
FIG. 4 is a sectional view illustrating a bonding structure of the semiconductor device in accordance with an embodiment of the present disclosure.

FIG. 4 is a sectional view illustrating a bonding structure of the semiconductor device in accordance with an embodiment of the present disclosure.

Referring to FIG. 4, a lower structure U and an upper structure T may have a structure in which the lower structure U is adhered to the upper structure T through a bonding process.

The lower structure U may include first lower lines M1_1, second lower lines M1_2, third lower lines M1_3, first lower contacts CT1_1, second lower contacts CT1_2, third lower contacts CT1_3, and lower bonding pads BP1.

The first lower lines M1_1 may be disposed to be adjacent to each other on the same plane. The second lower lines M1_2 may be disposed above the first lower lines M1_1 to overlap with the first lower lines M1_1. The second lower lines M1_2 may be disposed to be adjacent to each other on the same plane. The first lower contacts CT1_1 may be disposed between the first lower lines M1_1 and the second lower lines M1_2. The first lower contacts CT1_1 may electrically connect the first lower lines M1_1 to the second lower lines M1_2. That is, bottom end portions of the first lower contacts CT1_1 may be directly connected to the first lower lines M1_1, and top end portions of the first lower contacts CT1_1 may be directly connected to the second lower lines M1_2.

The third lower lines M1_3 may be disposed above the second lower lines M1_2 to overlap with the second lower lines M1_2. The third lower lines M1_3 may be disposed to be adjacent to each other on the same plane. The second lower contacts CT1_2 may be disposed between the second lower lines M1_2 and the third lower line M1_3. The second lower contacts CT1_2 may electrically connect the second lower lines M1_2 to the third lower lines M1_3. That is, bottom end portions of the second lower contacts CT1_2 may be directly connected to the second lower lines M1_2, and top end portions of the second lower contacts CT1_2 may be directly connected to the third lower lines M1_3. One third lower line M1_3 may correspond to at least two second lower lines M1_2. That is, one third lower line M1_3 may be connected to at least two second lower line M1_2 through the second lower contacts CT1_2.

A plurality of first lower lines M1_1 may be electrically connected to each other through the first lower contacts CT1_1, the second lower lines M1_2, the second lower contacts CT1_2, and the third lower lines M1_3.

The lower bonding pads BP1 may be disposed at an uppermost portion of the lower structure U. Each of the lower bonding pads BP1 may have a surface that is on the same plane as a surface of the lower structure U. The lower bonding pads BP1 may be electrically connected to the third lower lines M1_3 through the third lower contacts CT1_3.

The lower structure U may further include a lower insulating structure INS1 covering the first lower lines M1_1, the second lower lines M1_2, the third lower lines M1_3, the first lower contacts CT1_1, the second lower contacts CT1_2, and the third lower contacts CT1_3. That is, the first lower lines M1_1, the second lower lines M1_2, the third lower lines M1_3, the first lower contacts CT1_1, the second lower contacts CT1_2, and the third lower contacts CT1_3 may be buried inside of the lower insulating structure INS1.

The first lower lines M1_1, the second lower lines M1_2, the third lower lines M1_3, the first lower contacts CT1_1, the second lower contacts CT1_2, the third lower contacts CT1_3, and the lower bonding pads BP1 may be components corresponding to the above-described second connection structure 2nd_CS, shown in FIG. 3.

The first lower lines M1_1, the second lower lines M1_2, the third lower lines M1_3, the first lower contacts CT1_1, the second lower contacts CT1_2, the third lower contacts CT1_3, and the lower bonding pads BP1 are not limited to the example shown in the drawing and may be variously changed.

The upper structure T may include first upper lines M2_1, second upper lines M2_2, third upper lines M2_3, first upper contacts CT2_1, second upper contacts CT2_2, and upper bonding pads BP2.

The first upper lines M2_1 may be disposed to be adjacent to each other on the same plane. The second upper lines M2_2 may be disposed under the first upper lines M2_1 to overlap with the first upper lines M2_1. The second upper lines M2_2 may be disposed to be adjacent to each other on the same plane. The first upper contacts CT2_1 may be disposed between the first upper lines M2_1 and the second upper lines M2_2. The first upper contacts CT2_1 may electrically connect the first upper lines M2_1 to the second upper lines M2_2. That is, top end portions of the first upper contacts CT2_1 may be directly connected to the first upper lines M2_1, and bottom end portions of the first upper contacts CT2_1 may be directly connected to the second upper line M2_2. A plurality of first upper lines M2_1 may be electrically connected to each other through the first upper contacts CT2_1 and the second upper lines M2_2.

The third upper lines M2_3 may be disposed under the second upper line M2_2. The third upper lines M2_3 may be disposed to be adjacent to each other on the same plane. Any one of the third upper lines M2_3 may correspond to upper bonding pads BP2 that are adjacent to each other, and any one of third upper lines M2_3, corresponding to upper bonding pads BP2 that are adjacent to each other, may electrically connect upper bonding pads BP2 that are adjacent to each other.

The upper bonding pads BP2 may be disposed at a lowermost portion of the upper structure T. Each of the upper bonding pads BP2 may have a surface that is on the same plane as a surface of the upper structure T. The upper bonding pads BP2 may be electrically connected to the third upper lines M2_3 through the second upper contacts CT2_2.

The upper structure T may further include an upper insulating structure INS2 covering the first upper lines M2_1, the second upper lines M2_2, the third upper lines M2_3, the first upper contacts CT2_1, and the second upper contacts CT2_2. That is, the first upper lines M2_1, the second upper lines M2_2, the third upper lines M2_3, the first upper contacts CT2_1, and the second upper contacts CT2_2 may be buried inside of the upper insulating structure INS2.

The upper structure T may further include gate stack structures GST between the second upper lines M2_2 and the third upper lines M2_3.

The third upper lines M2_3, the second upper contacts CT2_2, and the upper bonding pads BP2 may be components corresponding to the above-described first connection structure 1st_CS, shown in FIG. 3, the gate stack structures GST may be components corresponding to the gate stack structures GST, shown in FIG. 3, and the first upper lines M2_1, the second upper lines M2_2, and the first upper contacts CT2_1 may correspond to the string line structure STL_S, shown in FIG. 3.

The first upper lines M2_1, the second upper lines M2_2, and the third upper line M2_3, the first upper contacts CT2_1, the second upper contacts CT2_2, and the upper bonding pads BP2 are not limited to the example shown in the drawing and may be variously changed.

An upper surface of the above-described lower structure U may adhere to a lower surface of the above-described upper structure T through a bonding process. For example, after the lower bonding pads BP1 are aligned to be in contact with the upper bonding pads BP2 in the bonding process, heat may be applied to the lower bonding pads BP1 and the upper bonding pads BP2, and then the lower bonding pads BP1 and the upper bonding pads BP2 may be cured. However, the present disclosure is not limited thereto, and various processes for connecting the lower bonding pads BP1 to the upper bonding pads BP2 may be introduced.

In the bonding structure of the semiconductor device, in accordance with the above-described embodiment, a plurality of lower bonding pads BP1 may be electrically connected to a plurality of upper bonding pads BP2 through the third upper lines M2_3, the second upper contact CT2_2, the third lower contacts CT1_3, and the third lower lines M1_3.

Figure 5:
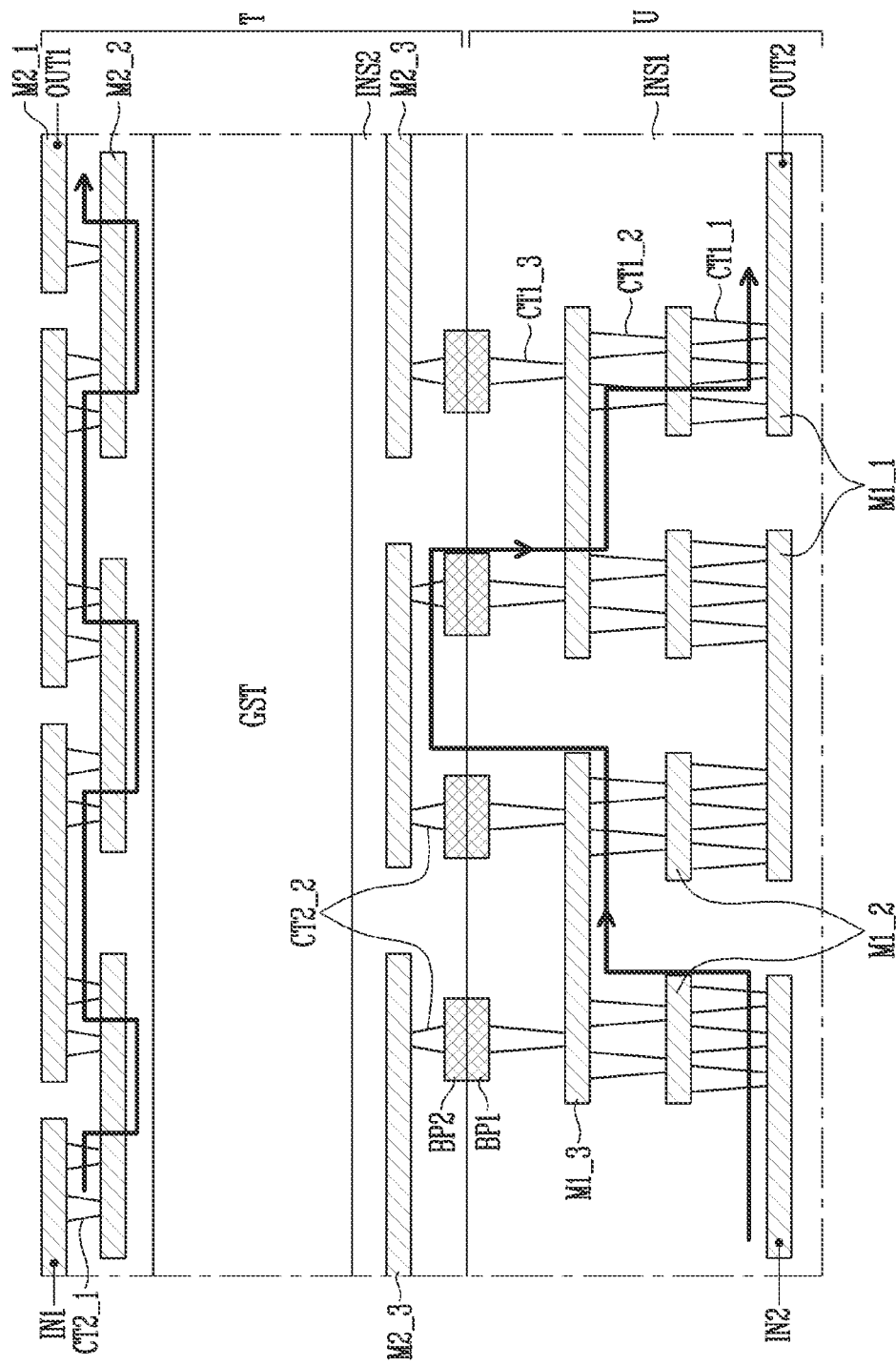
FIGS. 5 and 6 are views illustrating a current path in a test operation of the bonding structure of the semiconductor device in accordance with an embodiment of the present disclosure.
Figure 6:
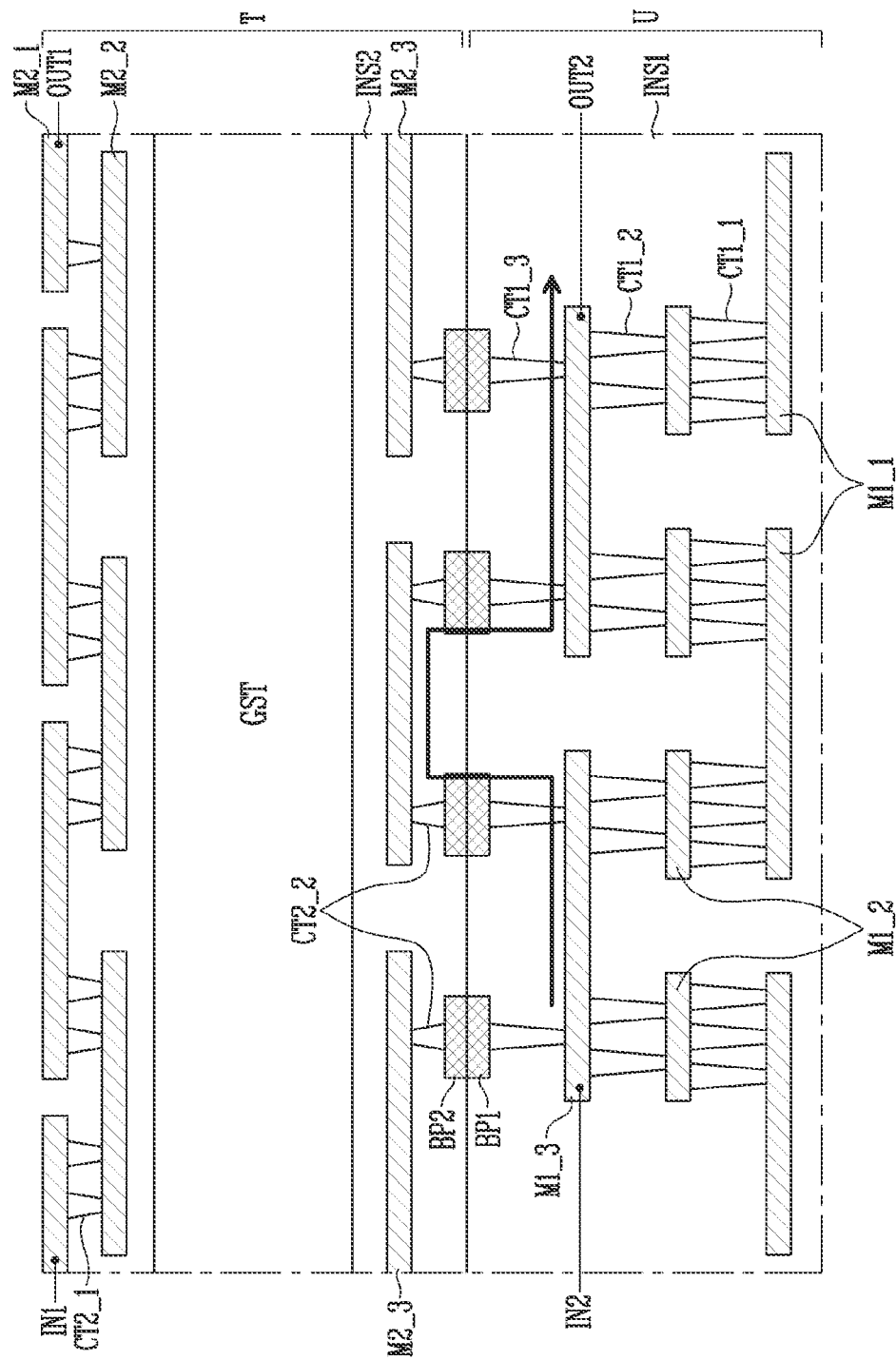

FIGS. 5 and 6 are views illustrating a current path in a test operation of the bonding structure of the semiconductor device in accordance with an embodiment of the present disclosure.

Referring to FIG. 5, an input terminal IN1 of the first defect detection circuit CDC1, shown in FIG. 1, may be connected to a first upper line, among the first upper lines M2_1, and an output terminal OUT1 of the first defect detection circuit CDC1 may be connected to another first upper line, among the first upper lines M2_1. Accordingly, when a test current is supplied through the input terminal IN1 of the first defect detection circuit CDC1, a test current path may be formed through the first upper lines M2_1, the first upper contacts CT21, and the second upper lines M2_2.

Based on a test current received through the output terminal OUT1, the first defect detection circuit CDC1 may detect whether any defect exists in the first upper lines M2_1, the first upper contacts CT21, and the second upper lines M2_2.

An input terminal IN2 of the second defect detection circuit CDC2 shown in FIG. 1 may be connected to a first lower line, among the first lower lines M1_1, and an output terminal OUT2 of the second defect detection circuit CDC2 may be connected to another first lower line, among the first lower lines M1_1. Accordingly, when a test current is supplied through the input terminal IN2 of the second defect detection circuit CDC2, a test current path may be formed through the first lower lines M1_1, the first lower contacts CT1_1, the second lower lines M1_2, the second lower contacts CT1_2, third lower lines M1_3, the third lower contacts CT1_3, the lower bonding pads BP1, the upper bonding pads BP2, the second upper contacts CT2_2, and the third upper lines M2_3.

Based on a test current received through the output terminal OUT2, the second defect detection circuit CDC2 may detect whether any defect exists in the first lower lines M1_1, the first lower contacts CT1_1, the second lower lines M1_2, the second lower contacts CT1_2, third lower lines M1_3, the third lower contacts CT1_3, the lower bonding pads BP1, the upper bonding pads BP2, the second upper contacts CT2_2, and the third upper lines M2_3.

Referring to FIG. 6, the input terminal IN2 of the second defect detection circuit CDC2, shown in FIG. 1, may be connected to a third lower line, among the third lower lines M1_3, and the output terminal OUT2 of the second defect detection circuit CDC2 may be connected to another third lower line, among the third lower lines M1_3. Accordingly, when a test current is supplied through the input terminal IN2 of the second defect detection circuit CDC2, a test current path may be formed through the third lower lines M1_3, the third lower contacts CT1_3, the lower bonding pads BP1, the upper bonding pad BP2, the second upper contacts CT2_2, and the third upper lines M2_3.

Based on a test current received through the output terminal OUT2, the second defect detection circuit CDC2 may detect whether any defect exists in the third lower lines M1_3, the third lower contacts CT1_3, the lower bonding pads BP1, the upper bonding pad BP2, the second upper contacts CT2_2, and the third upper lines M2_3.

Figure 7:
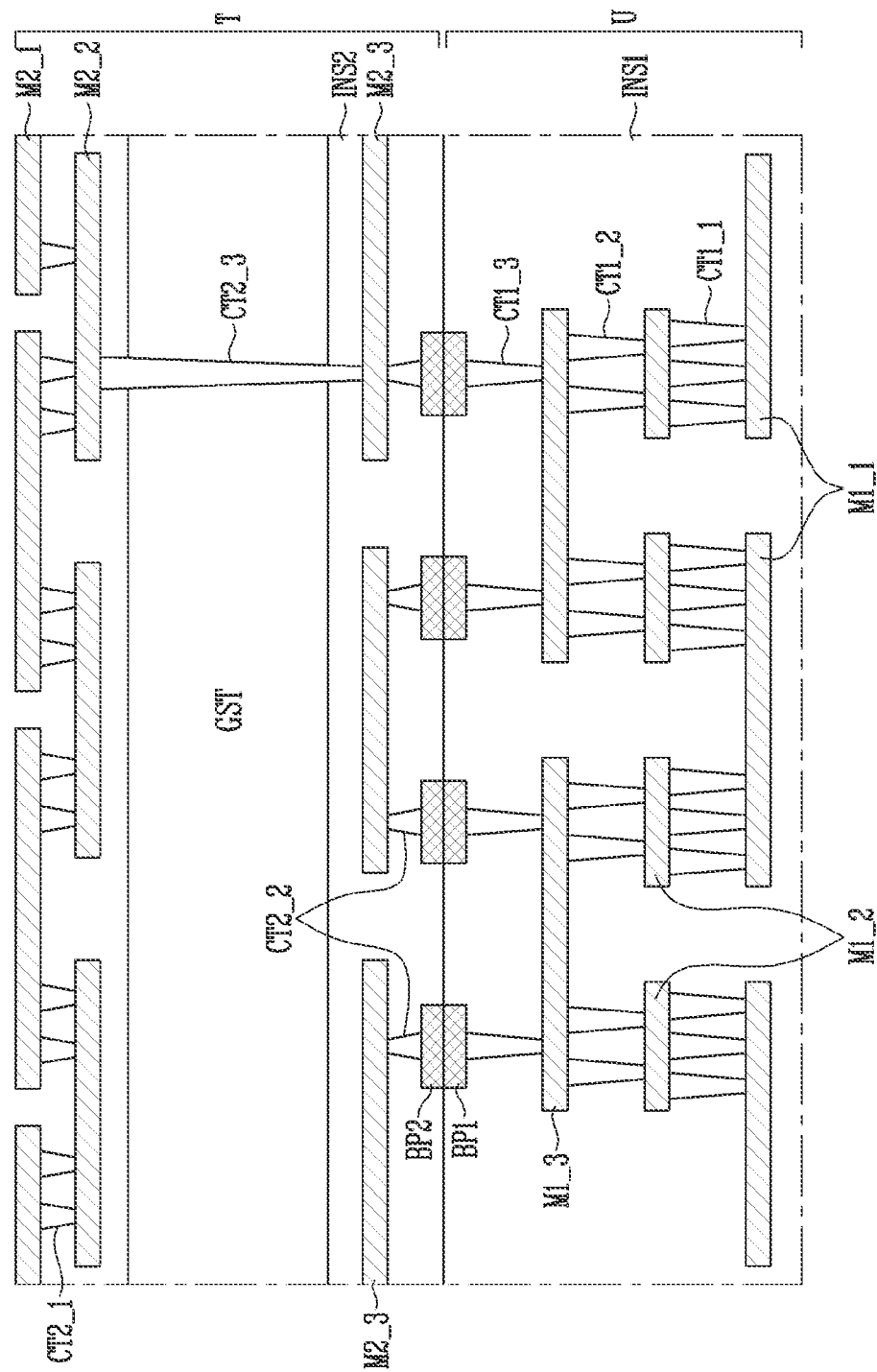
FIG. 7 is a sectional view illustrating a bonding structure of the semiconductor device in accordance with another embodiment of the present disclosure.

FIG. 7 is a sectional view illustrating a bonding structure of the semiconductor device in accordance with another embodiment of the present disclosure.

Referring to FIG. 7, a lower structure U and an upper structure T may have a structure in which the lower structure U is adhered to the upper structure T through a bonding process.

The lower structure U may include first lower lines M1_1, second lower lines M1_2, third lower lines M1_3, first lower contacts CT1_1, second lower contacts CT1_2, third lower contacts CT1_3, and lower bonding pads BP1.

The first lower lines M1_1 may be disposed to be adjacent to each other on the same plane. The second lower lines M1_2 may be disposed above the first lower lines M1_1 to overlap with the first lower lines M1_1. The second lower lines M1_2 may be disposed to be adjacent to each other on the same plane. The first lower contacts CT1_1 may be disposed between the first lower lines M1_1 and the second lower lines M1_2. The first lower contacts CT1_1 may electrically connect the first lower lines M1_1 and the second lower lines M1_2. That is, bottom end portions of the first lower contacts CT1_1 may be directly connected to the first lower lines M1_1, and top end portions of the first lower contacts CT1_1 may be directly connected to the second lower lines M1_2.

The third lower lines M1_3 may be disposed above the second lower lines M1_2 to overlap with the second lower lines M1_2. The third lower lines M1_3 may be disposed to be adjacent to each other on the same plane. The second lower contacts CT1_2 may be disposed between the second lower lines M1_2 and the third lower line M1_3. The second lower contacts CT1_2 may electrically connect the second lower lines M1_2 to the third lower lines M1_3. That is, bottom end portions of the second lower contacts CT1_2 may be directly connected to the second lower lines M1_2, and top end portions of the second lower contacts CT1_2 may be directly connected to the third lower lines M1_3. One third lower line M1_3 may correspond to at least two second lower lines M1_2. That is, one third lower line M1_3 may be connected to at least two second lower line M1_2 through the second lower contacts CT1_2.

A plurality of first lower lines M1_1 may be electrically connected to each other through the first lower contacts CT1_1, the second lower lines M1_2, the second lower contacts CT1_2, and the third lower lines M1_3.

The lower bonding pads BP1 may be disposed at an uppermost portion of the lower structure U. Each of the lower bonding pads BP1 may have a surface that is on the same plane as a surface of the lower structure U. The lower bonding pads BP1 may be electrically connected to the third lower lines M1_3 through the third lower contacts CT1_3.

The lower structure U may further include a lower insulating structure INS1 covering the first lower lines M1_1, the second lower lines M1_2, the third lower lines M1_3, the first lower contacts CT1_1, the second lower contacts CT1_2, and the third lower contacts CT1_3. That is, the first lower lines M1_1, the second lower lines M1_2, the third lower lines M1_3, the first lower contacts CT1_1, the second lower contacts CT1_2, and the third lower contacts CT1_3 may be buried inside of the lower insulating structure INS1.

The first lower lines M1_1, the second lower lines M1_2, the third lower lines M1_3, the first lower contacts CT1_1, the second lower contacts CT1_2, the third lower contacts CT1_3, and the lower bonding pads BP1 may be components corresponding to the above-described second connection structure 2nd_CS, shown in FIG. 3.

The first lower lines M1_1, the second lower lines M1_2, the third lower lines M1_3, the first lower contacts CT1_1, the second lower contacts CT1_2, the third lower contacts CT1_3, and the lower bonding pads BP1 are not limited to the example shown in the drawing and may be variously changed.

The upper structure T may include first upper lines M2_1, second upper lines M2_2, third upper lines M2_3, first upper contacts CT2_1, second upper contacts CT2_2, a third upper contact CT2_3, and upper bonding pads BP2.

The first upper lines M2_1 may be disposed to be adjacent to each other on the same plane. The second upper lines M2_2 may be disposed under the first upper lines M2_1 to overlap with the first upper lines M2_1. The second upper lines M2_2 may be disposed to be adjacent to each other on the same plane. The first upper contacts CT2_1 may be disposed between the first upper lines M2_1 and the second upper lines M2_2. The first upper contacts CT2_1 may electrically connect the first upper lines M2_1 to the second upper lines M2_2. That is, top end portions of the first upper contacts CT2_1 may be directly connected to the first upper lines M2_1, and bottom end portions of the first upper contacts CT2_1 may be directly connected to the second upper line M2_2. A plurality of first upper lines M2_1 may be electrically connected to each other through the first upper contacts CT2_1 and the second upper lines M2_2.

The third upper lines M2_3 may be disposed under the second upper line M2_2. The third upper lines M2_3 may be disposed to be adjacent to each other on the same plane.

The upper bonding pads BP2 may be disposed at a lowermost portion of the upper structure T. Each of the upper bonding pads BP2 may have a surface that is on the same plane as a surface of the upper structure T. The upper bonding pads BP2 may be electrically connected to the third upper lines M2_3 through the second upper contacts CT2_2.

The third upper contact CT2_3 may electrically connect any one of the second upper lines M2_2 to any one of the third upper lines M2_3. For example, the third upper contact CT2_3 may electrically connect any one of the second upper lines M2_2 to any one of the third upper lines M2_3, which are disposed to overlap with each other.

The upper structure T may further include an upper insulating structure INS2 covering the first upper lines M2_1, the second upper lines M2_2, the third upper lines M2_3, the first upper contacts CT2_1, and second upper contacts CT2_2. That is, the first upper lines M2_1, the second upper lines M2_2, the third upper lines M2_3, the first upper contacts CT2_1, and the second upper contacts CT2_2 may be buried inside of the upper insulating structure INS2.

The upper structure T may further include gate stack structures GST between the second upper lines M2_2 and the third upper lines M2_3. The third upper contact CT2_3 may be disposed while penetrating the gate stack structures GST.

The third upper lines M2_3, the second upper contacts CT2_2, and the upper bonding pads BP2 may be components corresponding to the above-described first connection structure 1st_CS shown in FIG. 3, the gate stack structures GST may be components corresponding to the gate stack structures GST, shown in FIG. 3, and the first upper lines M2_1, the second upper lines M2_2, and the first upper contacts CT2_1 may correspond to the string line structure STL_S shown in FIG. 3.

The first upper lines M2_1, the second upper lines M2_2, and the third upper line M2_3, the first upper contacts CT2_1, the second upper contacts CT2_2, and the upper bonding pads BP2 are not limited to the example shown in the drawing and may be variously changed.

An upper surface of the above-described lower structure U may be adhered to a lower surface of the above-described upper structure T through a bonding process.

In the bonding structure of the semiconductor device in accordance with the above-described embodiment, a plurality of lower bonding pads BP1 may be electrically connected to a plurality of upper bonding pads BP2 through the third upper lines M2_3, the second upper contact CT2_2, the third lower contacts CT1_3, and the third lower lines M1_3.

Figure 8:
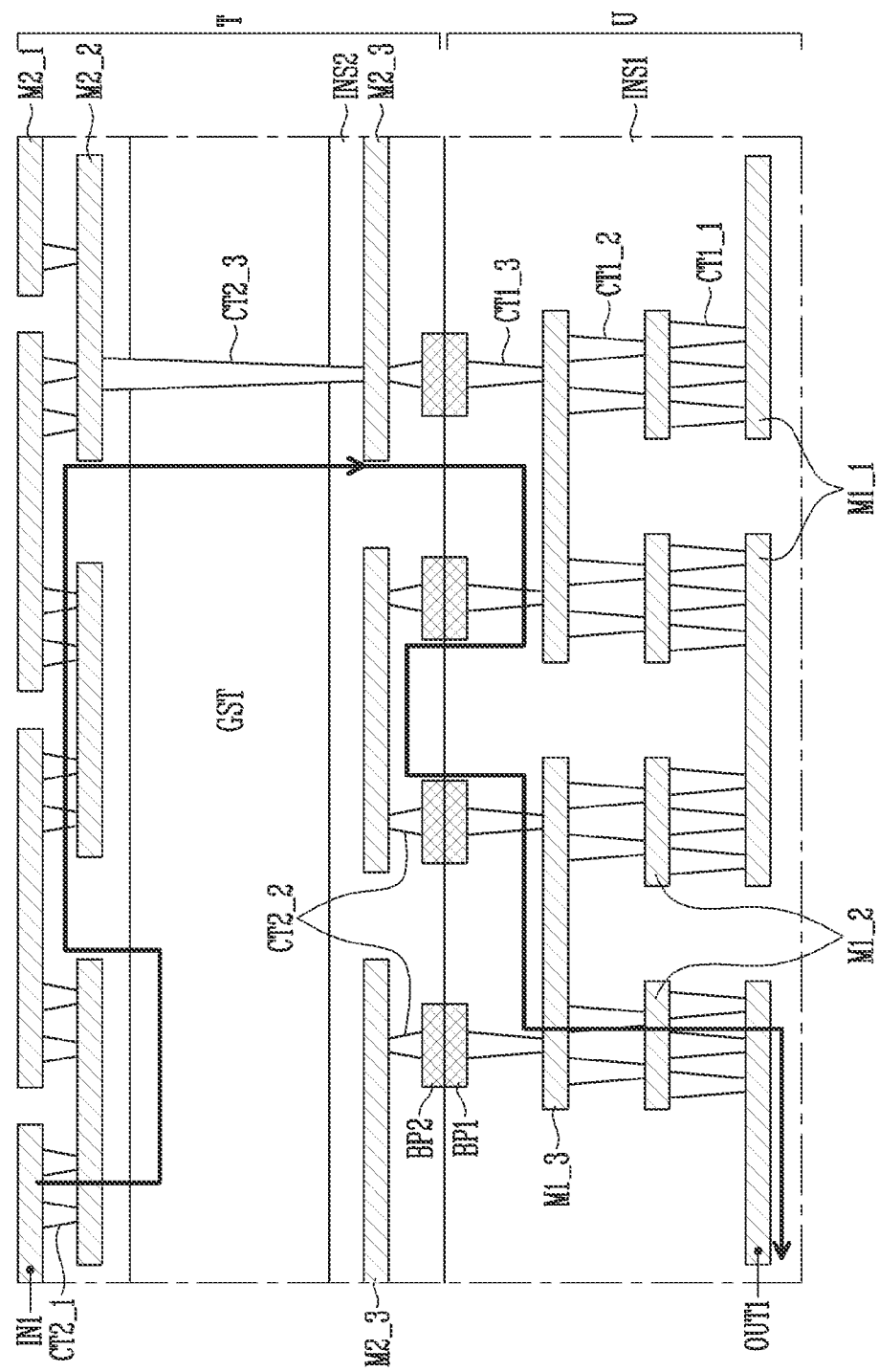
FIG. 8 is a view illustrating a current path in a test operation of the bonding structure of the semiconductor device in accordance with another embodiment of the present disclosure.

FIG. 8 is a view illustrating a current path in a test operation of the bonding structure of the semiconductor device in accordance with another embodiment of the present disclosure.

Referring to FIG. 8, the input terminal IN1 of the first defect detection circuit CDC1, shown in FIG. 1, may be connected to any one of the first upper lines M2_1, and the output terminal OUT1 may be connected to any one of the first lower lines M1_1. Accordingly, when a test current is supplied through the input terminal IN1 of the first defect detection circuit CDC1, a test current path may be formed through the first upper lines M2_1, the first upper contacts CT2_1, the second upper lines M2_2, the third upper contact CT2_3, the third upper lines M2_3, the second upper contacts CT2_2, the upper bonding pads BP2, the lower bonding pads BP1, the third lower contacts CT1_3, the third lower lines M1_3, the second lower contacts CT1_2, the second lower lines M1_2, the first lower contacts CT1_1, and the first lower lines M1_1.

Based on a test current received through the output terminal OUT1, the first defect detection circuit CDC1 may detect whether any defect exists in the first upper lines M2_1, the first upper contacts CT2_1, the second upper lines M2_2, the third upper contact CT2_3, the third upper lines M2_3, the second upper contacts CT2_2, the upper bonding pads BP2, the lower bonding pads BP1, the third lower contacts CT1_3, the third lower lines M1_3, the second lower contacts CT1_2, the second lower lines M1_2, the first lower contacts CT1_1, and the first lower lines M1_1.

Figure 9:
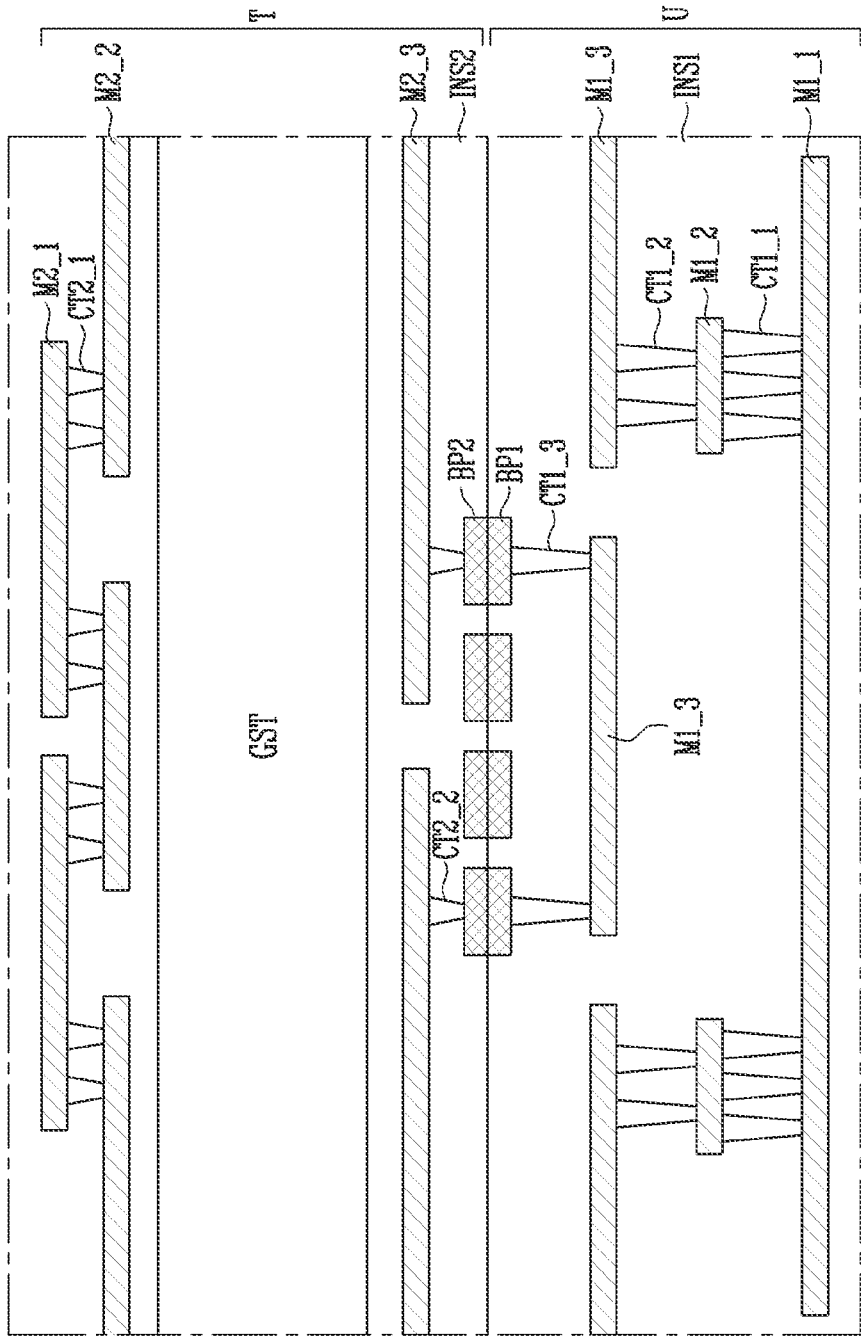
FIG. 9 is a sectional view illustrating a bonding structure of the semiconductor device in accordance with still another embodiment of the present disclosure.

FIG. 9 is a sectional view illustrating a bonding structure of the semiconductor device in accordance with still another embodiment of the present disclosure.

Referring to FIG. 9, a lower structure U and an upper structure T may have a structure in which the lower structure U is adhered to the upper structure T through a bonding process.

The lower structure U may include a first lower line M1_1, second lower lines M1_2, third lower lines M1_3, first lower contacts CT1_1, second lower contacts CT1_2, third lower contacts CT1_3, and lower bonding pads BP1.

The first lower line M1_1 may be disposed to extend in a horizontal direction. The second lower lines M1_2 may be disposed above the first lower line M1_1 to overlap with the first lower line M1_1. The second lower lines M1_2 may be disposed on the same plane. The first lower contacts CT1_1 may be disposed between the first lower line M1_1 and the second lower lines M1_2. The first lower contacts CT1_1 may electrically connect the first lower line M1_1 to the second lower lines M1_2. That is, bottom end portions of the first lower contact CT1_1 may be directly connected to the first lower line M1_1, and top end portions of the first lower contacts CT1_1 may be directly connected to the second lower lines M1_2.

The third lower lines M1_3 may be disposed to be adjacent to each other on the same plane. Some of the third lower lines M1_3 may be disposed above the second lower lines M1_2 to overlap with the second lower lines M1_2. The others of the third lower lines M1_3 may be disposed to not overlap with the second lower lines M1_2. The third lower lines M1_3 disposed to overlap with the second lower lines M1_2 may be connected to the second lower lines M1_2 through the second lower contacts CT1_2. That is, bottom end portions of the second lower contacts CT1_2 may be directly connected to the second lower lines M1_2, and top end portions of the second lower contacts CT1_2 may be directly connected to the third lower lines M1_3 disposed to overlap with the second lower lines M1_2. The other third lower lines M1_3, which are disposed to not overlap with the second lower lines M1_2, might not be electrically connected to the second lower lines M1_2.

The lower bonding pads BP1 may be disposed at an uppermost portion of the lower structure U. Each of the lower bonding pads BP1 may have a surface that is on the same plane as a surface of the lower structure U. Through the third lower contacts CT1_3, the lower bonding pads BP1 may be electrically connected to the other third lower lines M1_3 that are disposed to not overlap with the second lower lines M1_2.

The lower structure U may further include a lower insulating structure INS1 covering the first lower line M1_1, the second lower lines M1_2, the third lower lines M1_3, the first lower contacts CT1_1, the second lower contacts CT1_2, and the third lower contacts CT1_3. That is, the first lower line M1_1, the second lower lines M1_2, the third lower lines M1_3, the first lower contacts CT1_1, the second lower contacts CT1_2, and the third lower contacts CT1_3 may be buried inside of the lower insulating structure INS1.

The first lower line M1_1, the second lower lines M1_2, the third lower lines M1_3, the first lower contacts CT1_1, the second lower contacts CT1_2, the third lower contacts CT1_3, and the lower bonding pads BP1 may be components corresponding to the above-described second connection structure 2nd_CS, shown in FIG. 3.

The first lower line M1_1, the second lower lines M1_2, the third lower lines M1_3, the first lower contacts CT1_1, the second lower contacts CT1_2, the third lower contacts CT1_3, and the lower bonding pads BP1 are not limited to the example shown in the drawing and may be variously changed.

The upper structure T may include first upper lines M2_1, second upper lines M2_2, third upper lines M2_3, first upper contacts CT2_1, second upper contacts CT2_2, and upper bonding pads BP2.

The first upper lines M2_1 may be disposed to be adjacent to each other on the same plane. The second upper lines M2_2 may be disposed under the first upper lines M2_1 to overlap with the first upper lines M2_1. The second upper lines M2_2 may be disposed to be adjacent to each other on the same plane. The first upper contacts CT2_1 may be disposed between the first upper lines M2_1 and the second upper lines M2_2. The first upper contacts CT2_1 may electrically connect the first upper lines M2_1 to the second upper lines M2_2. That is, top end portions of the first upper contacts CT2_1 may be directly connected to the first upper lines M2_1, and bottom end portions of the first upper contacts CT2_1 may be directly connected to the second upper line M2_2. A plurality of first upper lines M2_1 may be electrically connected to each other through the first upper contacts CT2_1 and the second upper lines M2_2.

The third upper lines M2_3 may be disposed under the second upper line M2_2. The third upper lines M2_3 may be disposed to be adjacent to each other on the same plane.

The upper bonding pads BP2 may be disposed at a lowermost portion of the upper structure T. Each of the upper bonding pads BP2 may have a surface that is on the same plane as a surface of the upper structure T. The upper bonding pads BP2 may be electrically connected to the third upper lines M2_3 through the second upper contacts CT2_2.

The upper structure T may further include an upper insulating structure INS2 covering the first upper lines M2_1, the second upper lines M2_2, the third upper lines M2_3, the first upper contacts CT2_1, and the second upper contacts CT2_2. That is, the first upper lines M2_1, the second upper lines M2_2, the third upper lines M2_3, the first upper contacts CT2_1, and the second upper contacts CT2_2 may be buried inside of the upper insulating structure INS2.

The upper structure T may further include gate stack structures GST between the second upper lines M2_2 and the third upper lines M2_3.

The third upper lines M2_3, the second upper contacts CT2_2, and the upper bonding pads BP2 may be components corresponding to the above-described first connection structure 1st_CS shown in FIG. 3, the gate stack structures GST may be components corresponding to the gate stack structures GST, shown in FIG. 3, and the first upper lines M2_1, the second upper lines M2_2, and the first upper contacts CT2_1 may correspond to the string line structure STL_S, shown in FIG. 3.

The first upper lines M2_1, the second upper lines M2_2, and the third upper line M2_3, the first upper contacts CT2_1, the second upper contacts CT2_2, and the upper bonding pads BP2 are not limited to the example shown in the drawing and may be variously changed.

An upper surface of the above-described lower structure U may be adhered to a lower surface of the above-described upper structure T through a bonding process.

In the bonding structure of the semiconductor device in accordance with the above-described embodiment, a plurality of lower bonding pads BP1 and a plurality of upper bonding pads BP2 may be electrically connected to some of the third upper lines M2_3, the second upper contact CT2_2, the third lower contacts CT1_3, and the third lower lines M1_3.

Figure 10:
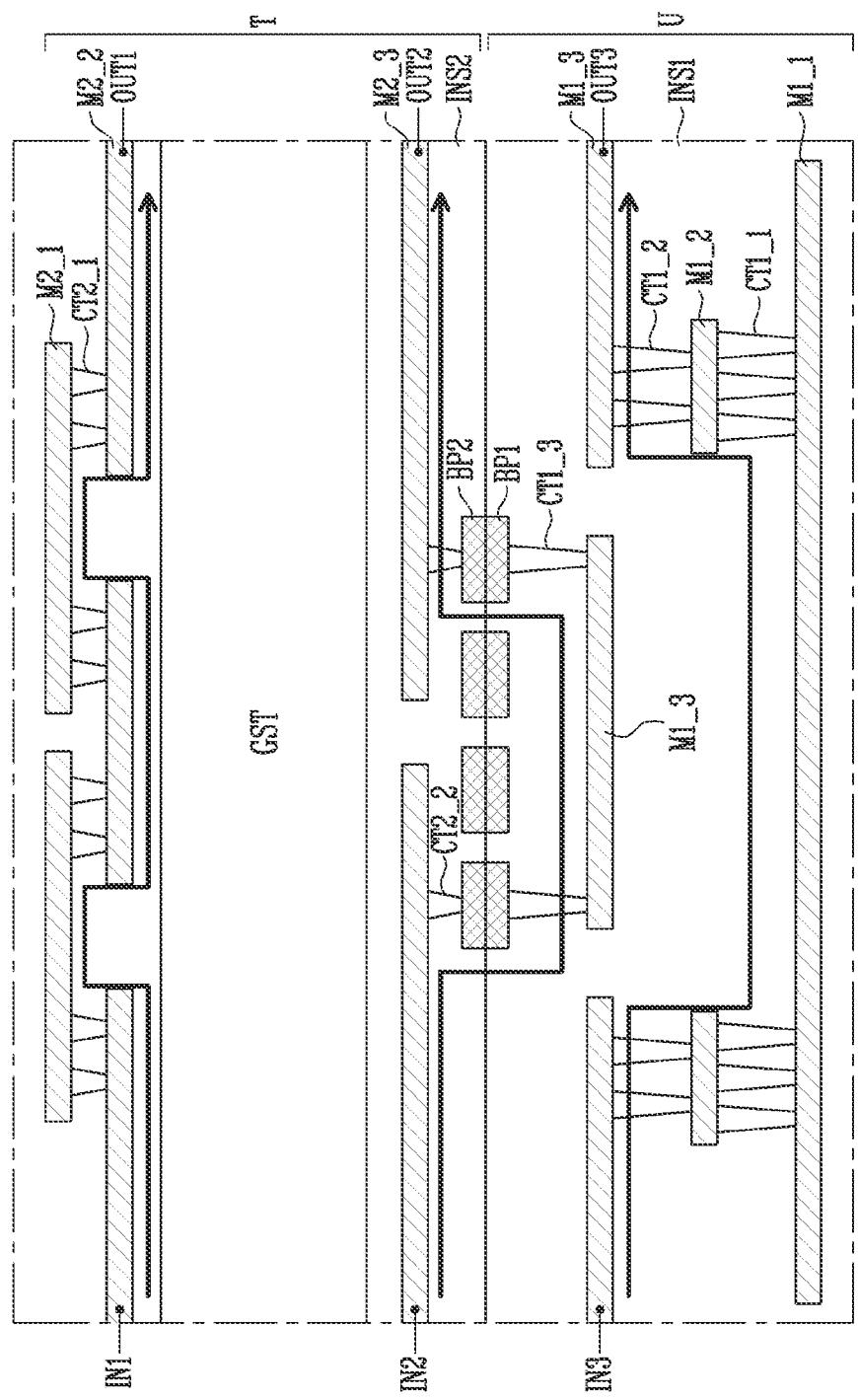
FIG. 10 is a view illustrating a current path in a test operation of the bonding structure of the semiconductor device in accordance with still another embodiment of the present disclosure.

FIG. 10 is a view illustrating a current path in a test operation of the bonding structure of the semiconductor device in accordance with still another embodiment of the present disclosure.

Referring to FIG. 10, the input terminal IN1 of the first defect detection circuit CDC1, shown in FIG. 1, may be connected to a second upper line, among the second upper lines M2_2, and the output terminal OUT1 of the first defect detection circuit CDC1 may be connected to another second upper line, among the second upper lines M2_2. Accordingly, when a test current is supplied through the input terminal IN1 of the first defect detection circuit CDC1, a test current path may be formed through the first upper lines M2_1, the first upper contacts CT21, and the second upper lines M2_2.

Based on a test current received through the output terminal OUT1, the first defect detection circuit CDC1 may detect whether any defect exists in the first upper lines M2_1, the first upper contacts CT21, and the second upper lines M2_2.

The input terminal IN2 of the second defect detection circuit CDC2, shown in FIG. 1, may be connected to a third upper line, among the third upper lines M2_3, and the output terminal OUT2 of the second defect detection circuit CDC2 may be connected to another third upper line, among the third upper lines M2_3. Accordingly, when a test current is supplied through the input terminal IN2 of the second defect detection circuit CDC2, a test current path may be formed through some of the third upper lines M2_3, the second upper contacts CT2_2, the third lower contact CT1_3, and the third lower lines M1_3.

Based on a test current received through the output terminal OUT2, the second defect detection circuit CDC2 may detect whether any defect exists in some of the third upper lines M2_3, the second upper contacts CT2_2, the third lower contact CT1_3, and the third lower lines M1_3.

An input terminal IN3 of an additional defect detection circuit, e.g., a third defect detection circuit may be connected to a third lower line, among the third lower lines M1_3 that overlap with the second lower lines M1_2, and an output terminal OUT3 of the third defect detection circuit may be connected to another third lower line, among the third lower lines M1_3 that overlap with the second lower lines M1_2. Accordingly, when a test current is supplied through the input terminal IN3 of the third defect detection circuit, a test current path may be formed through the third lower lines M1_3 that overlap with the second lower lines M1_2, the second lower contacts CT1_2, the second lower lines M1_2, the first lower contacts CT1_1, and the first lower line M1_1.

Based on a test current received through the output terminal OUT3, the third defect detection circuit may detect whether any defect exists in the third lower lines M1_3 that overlap with the second lower lines M1_2, the second lower contacts CT1_2, the second lower lines M1_2, the first lower contacts CT1_1, and the first lower line M1_1.

Figure 11:
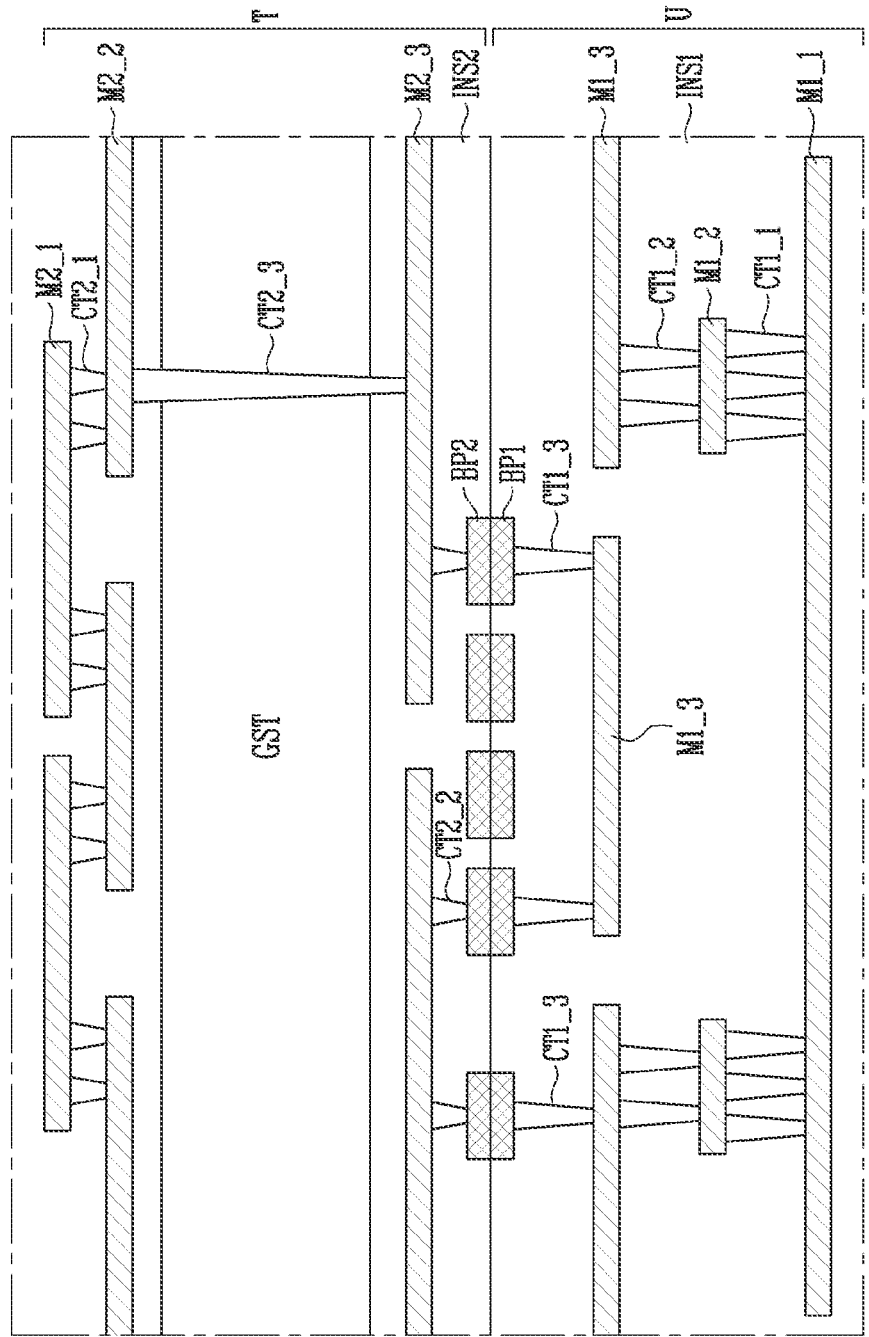
FIG. 11 is a sectional view illustrating a bonding structure of the semiconductor device in accordance with still another embodiment of the present disclosure.

FIG. 11 is a sectional view illustrating a bonding structure of the semiconductor device in accordance with still another embodiment of the present disclosure.

Referring to FIG. 11, a lower structure U and an upper structure T may have a structure in which the lower structure U is adhered to the upper structure T through a bonding process.

The lower structure U may include a first lower line M1_1, second lower lines M1_2, third lower lines M1_3, first lower contacts CT1_1, second lower contacts CT1_2, third lower contacts CT1_3, and lower bonding pads BP1.

The first lower line M1_1 may be disposed to extend in a horizontal direction. The second lower lines M1_2 may be disposed above the first lower line M1_1 to overlap with the first lower line M1_1. The second lower lines M1_2 may be disposed on the same plane. The first lower contacts CT1_1 may be disposed between the first lower line M1_1 and the second lower lines M1_2. The first lower contacts CT1_1 may electrically connect the first lower line M1_1 to the second lower lines M1_2. That is, bottom end portions of the first lower contact CT1_1 may be directly connected to the first lower line M1_1, and top end portions of the first lower contacts CT1_1 may be directly connected to the second lower lines M1_2.

The third lower lines M1_3 may be disposed to be adjacent to each other on the same plane. Some of the third lower lines M1_3 may be disposed above the second lower lines M1_2 to overlap with the second lower lines M1_2. The other third lower lines M1_3 may be disposed to not overlap with the second lower lines M1_2. The third lower lines M1_3 disposed to overlap with the second lower lines M1_2 may be connected to the second lower lines M1_2 through the second lower contacts CT1_2. That is, bottom end portions of the second lower contacts CT1_2 may be directly connected to the second lower lines M1_2, and top end portions of the second lower contacts CT1_2 may be directly connected to the third lower lines M1_3 disposed to overlap with the second lower lines M1_2. The other third lower lines M1_3, which are disposed to not overlap with the second lower lines M1_2, might not be electrically connected to the second lower lines M1_2.

The lower bonding pads BP1 may be disposed at an uppermost portion of the lower structure U. Each of the lower bonding pads BP1 may have a surface that is on the same plane as a surface of the lower structure U. Through the third lower contacts CT1_3, some of the lower bonding pads BP1 may be electrically connected to the third lower lines M1_3 that are disposed to not overlap with the second lower lines M1_2. In addition, other lower bonding pads BP1 may be electrically connected to the third lower lines M1_3 that are disposed to overlap with the second lower lines M1_2, through the third lower contacts CT1_3.

The lower structure U may further include a lower insulating structure INS1 covering the first lower line M1_1, the second lower lines M1_2, the third lower lines M1_3, the first lower contacts CT1_1, the second lower contacts CT1_2, and the third lower contacts CT1_3. That is, the first lower line M1_1, the second lower lines M1_2, the third lower lines M1_3, the first lower contacts CT1_1, the second lower contacts CT1_2, and the third lower contacts CT1_3 may be buried inside of the lower insulating structure INS1.

The first lower line M1_1, the second lower lines M1_2, the third lower lines M1_3, the first lower contacts CT1_1, the second lower contacts CT1_2, the third lower contacts CT1_3, and the lower bonding pads BP1 may be components corresponding to the above-described second connection structure 2nd_CS, shown in FIG. 3.

The first lower line M1_1, the second lower lines M1_2, the third lower lines M1_3, the first lower contacts CT1_1, the second lower contacts CT1_2, the third lower contacts CT1_3, and the lower bonding pads BP1 are not limited to the example shown in the drawing and may be variously changed.

The upper structure T may include first upper lines M2_1, second upper lines M2_2, third upper lines M2_3, first upper contacts CT2_1, second upper contacts CT2_2, a third upper contact CT2_3, and upper bonding pads BP2.

The first upper lines M2_1 may be disposed to be adjacent to each other on the same plane. The second upper lines M2_2 may be disposed under the first upper lines M2_1 to overlap with the first upper lines M2_1. The second upper lines M2_2 may be disposed to be adjacent to each other on the same plane. The first upper contacts CT2_1 may be disposed between the first upper lines M2_1 and the second upper lines M2_2. The first upper contacts CT2_1 may electrically connect the first upper lines M2_1 to the second upper lines M2_2. That is, top end portions of the first upper contacts CT2_1 may be directly connected to the first upper lines M2_1, and bottom end portions of the first upper contacts CT2_1 may be directly connected to the second upper line M2_2. A plurality of first upper lines M2_1 may be electrically connected to each other through the first upper contacts CT2_1 and the second upper lines M2_2.

The third upper lines M2_3 may be disposed under the second upper line M2_2. The third upper lines M2_3 may be disposed to be adjacent to each other on the same plane. Some of the second upper lines M2_2 may be connected to the third upper lines M2_3 through the third upper contact CT2_3.

The upper bonding pads BP2 may be disposed at a lowermost portion of the upper structure T. Each of the upper bonding pads BP2 may have a surface that is on the same plane as a surface of the upper structure T. The upper bonding pads BP2 may be electrically connected to the third upper lines M2_3 through the second upper contacts CT2_2.

The upper structure T may further include an upper insulating structure INS2 covering the first upper lines M2_1, the second upper lines M2_2, the third upper lines M2_3, the first upper contacts CT2_1, and the second upper contacts CT2_2. That is, the first upper lines M2_1, the second upper lines M2_2, the third upper lines M2_3, the first upper contacts CT2_1, and the second upper contacts CT2_2 may be buried inside of the upper insulating structure INS2.

The upper structure T may further include gate stack structures GST between the second upper lines M2_2 and the third upper lines M2_3.

The third upper lines M2_3, the second upper contacts CT2_2, and the upper bonding pads BP2 may be components corresponding to the above-described first connection structure 1st_CS, shown in FIG. 3, the gate stack structures GST may be components corresponding to the gate stack structures GST, shown in FIG. 3, and the first upper lines M2_1, the second upper lines M2_2, and the first upper contacts CT2_1 may correspond to the string line structure STL_S, shown in FIG. 3. The first upper lines M2_1, the second upper lines M2_2, and the third upper line M2_3, the first upper contacts CT2_1, the second upper contacts CT2_2, and the upper bonding pads BP2 are not limited to the example shown in the drawing and may be variously changed.

An upper surface of the above-described lower structure U may be adhered to a lower surface of the above-described upper structure T through a bonding process.

In the bonding structure of the semiconductor device in accordance with the above-described embodiment, a plurality of lower bonding pads BP1 and a plurality of upper bonding pads BP2 are electrically connected to some of the third upper lines M2_3, the second upper contact CT2_2, the third lower contacts CT1_3, and the third lower lines M1_3.

Figure 12:
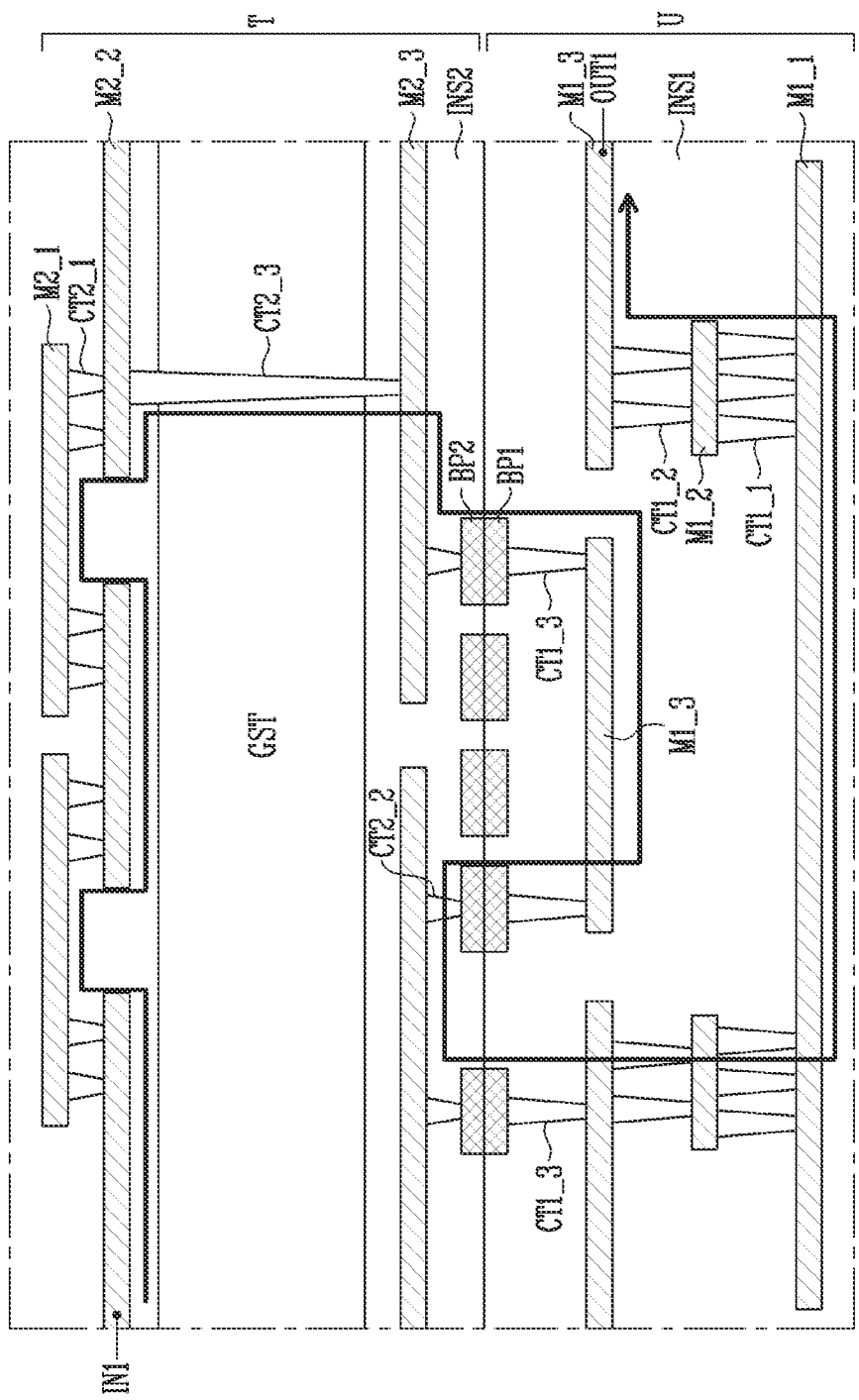
FIG. 12 is a view illustrating a current path in a test operation of the bonding structure of the semiconductor device in accordance with still another embodiment of the present disclosure.

FIG. 12 is a view illustrating a current path in a test operation of the bonding structure of the semiconductor device in accordance with still another embodiment of the present disclosure.

Referring to FIG. 12, the input terminal IN1 of the first defect detection circuit CDC1, shown in FIG. 1, may be connected to a second upper line, among the second upper lines M2_2, and the output terminal OUT1 of the first defect detection circuit CDC1 may be connected to another third lower line, among the third lower lines M1_3. Accordingly, when a test current is supplied through the input terminal IN1 of the first defect detection circuit CDC1, a test current path may be formed through the second upper lines M2_2, the first upper contacts CT2_1, the first upper lines M2_1, the third upper contact CT2_3, the third upper lines M2_3, the second upper contacts CT2_2, the upper bonding pads BP2, the lower bonding pads BP1, the third lower contacts CT1_3, the third lower lines M1_3, the second lower contacts CT1_2, the second lower lines M1_2, the first lower contacts CT1_1, and the first lower line M1_1.

Based on a test current received through the output terminal OUT1, the first defect detection circuit CDC1 may detect whether any defect exists in the second upper lines M2_2, the first upper contacts CT2_1, the first upper lines M2_1, the third upper contact CT2_3, the third upper lines M2_3, the second upper contacts CT2_2, the upper bonding pads BP2, the lower bonding pads BP1, the third lower contacts CT1_3, the third lower lines M1_3, the second lower contacts CT1_2, the second lower lines M1_2, the first lower contacts CT1_1, and the first lower line M1_1.

Figure 13:
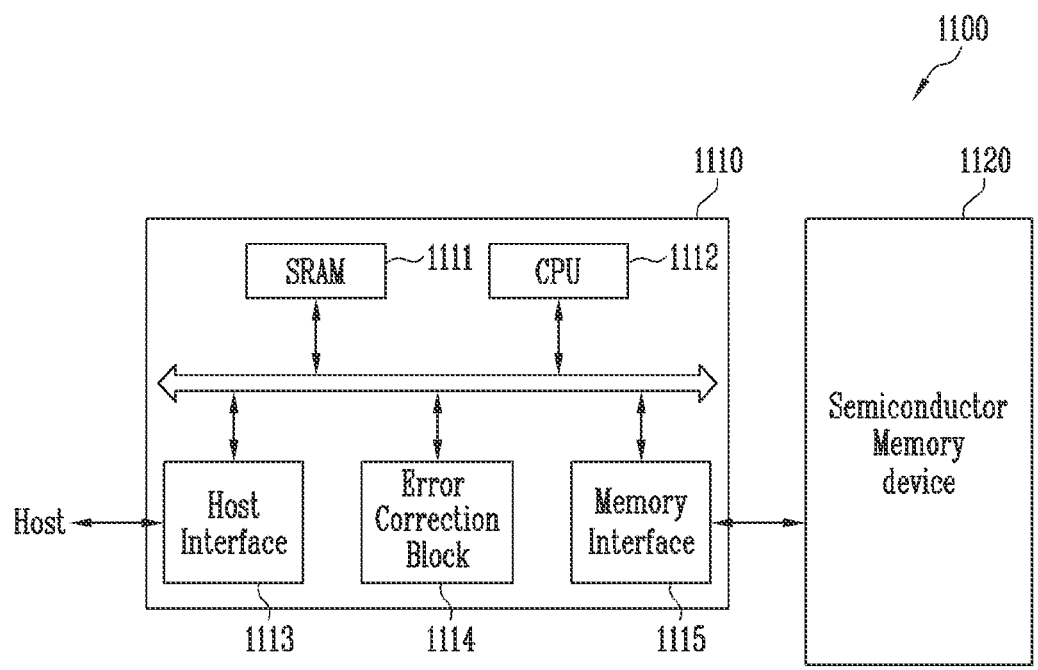
FIG. 13 is a block diagram illustrating a configuration of a memory system in accordance with an embodiment of the present disclosure.

FIG. 13 is a block diagram illustrating a configuration of a memory system in accordance with an embodiment of the present disclosure.

Referring to FIG. 13, the memory system 1100 may include a semiconductor memory device 1120 and a memory controller 1110.

The semiconductor memory device 1120 may be the semiconductor device 100 described with reference to FIGS. 1 and 2.

The memory controller 1110 may control the semiconductor memory device 1120 and may include a Static Random Access Memory (SRAM) 1111, a Central Processing Unit (CPU) 1112, a host interface 1113, an error correction block 1114, and a memory interface 1115. The SRAM 1111 may be used as a working memory of the CPU 1112, the CPU 1112 may perform overall control operations for data exchange of the memory controller 1110, and the host interface 1113 may include a data exchange protocol for a host connected with the memory system 1100. In addition, the error correction block 1114 may detect and correct an error included in a data read from the semiconductor memory device 1120, and the memory interface 1115 may interface with the semiconductor memory device 1120. In addition, the memory controller 1110 may further include a Read Only Memory (ROM) for storing code data for interfacing with the host, and the like.

The memory system 1100 configured as described above may be a memory card or a Solid State Disk (SSD) in which the semiconductor memory device 1120 is combined with the memory controller 1110. For example, when the memory system 1100 is an SSD, the memory controller 1110 may communicate with an external device (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 14:
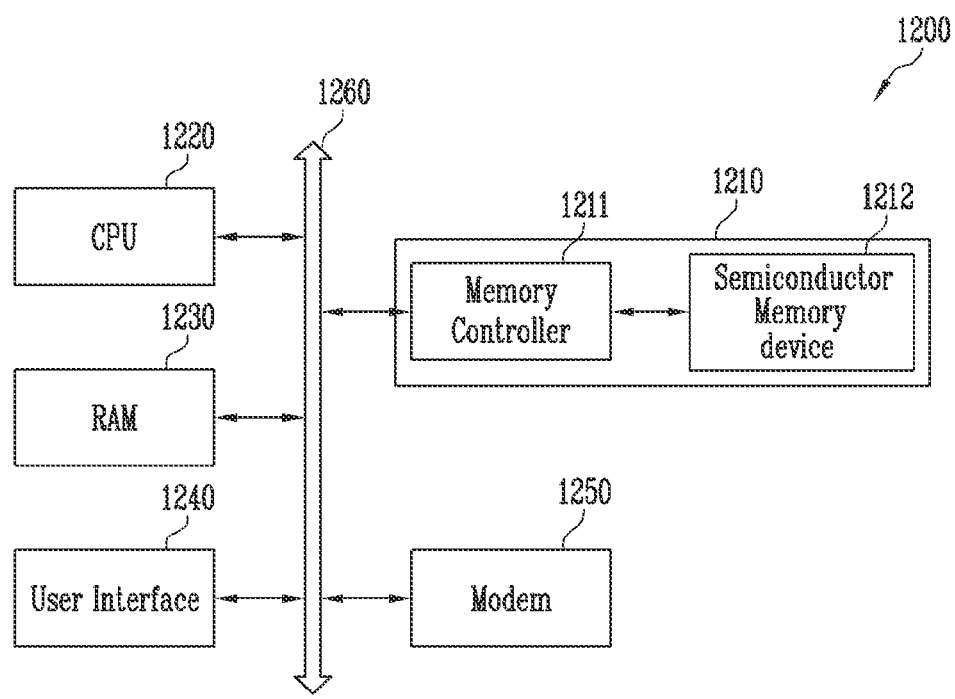
FIG. 14 is a block diagram illustrating a configuration of a computing system in accordance with an embodiment of the present disclosure.

FIG. 14 is a block diagram illustrating a configuration of a computing system in accordance with an embodiment of the present disclosure.

Referring to FIG. 14, the computing system 1200, in accordance with the embodiment of the present disclosure, may include a CPU 1220, a random access memory (RAM) 1230, a user interface 1240, a modem 1250, and a memory system 1210, which are electrically connected to a system bus 1260. In addition, when the computing system 1200 is a mobile device, a battery for supplying an operation voltage to the computing system 1200 may be further included, and an application chip set, an image processor, a mobile D-RAM, and the like may be further included. The memory system 1210 may be configured as the above-described memory system 1100, shown in FIG. 13.

In accordance with the present disclosure, a bonding line may be connected to a defect detection circuit in the semiconductor device formed using a wafer bonding technique, thereby detecting whether any defect exists in the bonding line.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made based on the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made based on the technological scope of the present disclosure in addition to the embodiments disclosed herein.

What is claimed is:

1. A semiconductor device comprising:
    a plurality of upper bonding pads;
    a plurality of lower bonding pads adhered to the plurality of upper bonding pads;
    a first upper line electrically connecting upper bonding pads, among the plurality of upper bonding pads, to each other;
    a plurality of lower lines electrically connected to the plurality of lower bonding pads; and
    a first defect detection circuit including an input terminal connected to a lower line, among the plurality of lower lines, and an output terminal connected to another lower line, among the plurality of lower lines.

2. The semiconductor device of claim 1, wherein the plurality of upper bonding pads and the plurality of lower bonding pads have a structure in which the plurality of upper bonding pads are adhered to the plurality of lower bonding pads through a bonding process.

3. The semiconductor device of claim 1, wherein the first upper line electrically connects some upper bonding pads that are adjacent to each other, among the plurality of upper bonding pads.

4. The semiconductor device of claim 1, further comprising:
    first upper contacts for connecting the first upper line to the upper bonding pads; and
    lower contacts for connecting the plurality of lower lines to the lower bonding pads.

5. The semiconductor device of claim 1, further comprising:
    a gate stack structure formed above the first upper line;
    a plurality of second upper lines disposed above the gate stack structure;
    a plurality of third upper lines disposed above the plurality of second upper line;
    second upper contacts for connecting the plurality of second upper lines to the plurality of third upper lines; and
    a second defect detection circuit including an input terminal connected to a third upper line, among the plurality of third upper lines, and an output terminal connected to another third upper line, among the plurality of third upper lines.

6. A semiconductor device comprising:
    a plurality of upper bonding pads;
    a plurality of lower bonding pads adhered to the plurality of upper bonding pads;
    a first upper line electrically connecting upper bonding pads, among the plurality of upper bonding pads, to each other;
    a gate stack structure formed above the first upper line;
    a plurality of second upper lines disposed above the gate stack structure;
    a first upper contact extending in a vertical direction in the gate stack structure to connect the first upper line to a second upper line, among the plurality of second upper lines;
    a plurality of lower lines electrically connected to the plurality of lower bonding pads; and
    a defect detection circuit including an output terminal connected to a lower line, among the plurality of lower lines.

7. The semiconductor device of claim 6, comprising:
    a plurality of third upper lines formed above the plurality of second upper lines; and
    a plurality of second upper contacts for connecting the plurality of third upper lines to the plurality of second upper lines,
    wherein the plurality of third upper lines are connected to each other through the plurality of second upper lines and the plurality of second upper contacts, and
    wherein an input terminal of the defect detection circuit is connected to a third upper line, among the plurality of third upper lines.

8. The semiconductor device of claim 6, wherein the plurality of upper bonding pads and the plurality of lower bonding pads have a structure in which the plurality of upper bonding pads are adhered to the plurality of lower bonding pads through a bonding process.

9. The semiconductor device of claim 6, wherein the first upper line electrically connects some bonding pads that are adjacent to each other, among the upper bonding pads.

10. A semiconductor device comprising:
    a plurality of upper bonding pads;
    a plurality of lower bonding pads adhered to the plurality of upper bonding pads;
    a plurality of first upper lines electrically connected to the plurality of upper bonding pads;

a first lower line electrically connecting the plurality of lower bonding pads to each other; and a first defect detection circuit including an input terminal connected to a first upper line, among the plurality of first upper lines, and an output terminal connected to another first upper line, among the plurality of first upper lines.

11. The semiconductor device of claim 10, wherein the upper bonding pads are adhered to the lower bonding pads through a bonding process.

12. The semiconductor device of claim 10, further comprising:

a gate stack structure formed above the plurality of first upper lines;

a plurality of second upper lines disposed above the gate stack structure;

a plurality of third upper lines disposed above the plurality of second upper lines;

second upper contacts for connecting the plurality of second upper lines to the plurality of third upper lines; and a second defect detection circuit including an input terminal connected to a third upper line, among the plurality of third upper lines, and an output terminal connected to another third upper line, among the plurality of third upper lines.

13. The semiconductor device of claim 10, further comprising:

a plurality of second lower lines formed on the same plane as the first lower line, the second lower lines being electrically spaced apart from the first lower line;

a third lower line extending in a horizontal direction under the second lower lines;

lower contacts for connecting the plurality of second lower lines to the third lower line; and a third defect detection circuit including an input terminal connected to a second lower line, among the plurality of second lower lines, and an output terminal connected to another second lower line, among the plurality of second lower lines.

14. A semiconductor device comprising:

a plurality of upper bonding pads;

a plurality of lower bonding pads adhered to the plurality of upper bonding pads;

a plurality of first upper lines electrically connected to the plurality of upper bonding pads;

a gate stack structure formed above the plurality of first upper lines;

a plurality of second upper lines disposed above the gate stack structure;

a first upper contact extending in a vertical direction in the gate stack structure to connect a first upper line, among the plurality of first upper lines, to a second upper line, among the plurality of second upper lines;

a first lower line electrically connecting the plurality of lower bonding pads to each other; and a defect detection circuit including an input terminal connected to another second upper line, among the plurality of second upper lines.

15. The semiconductor device of claim 14, wherein the plurality of upper bonding pads are adhered to the plurality of lower bonding pads through a bonding process.

16. The semiconductor device of claim 14, further comprising:

a plurality of third upper lines disposed above the second upper line; and a plurality of second upper contacts for connecting the plurality of second upper lines to the plurality of third upper lines.

17. The semiconductor device of claim 14, comprising:

a plurality of second lower lines formed on the same plane as the first lower line, the second lower lines being electrically spaced apart from the first lower line;

a third lower line extending in a horizontal direction under the plurality of second lower lines; and lower contacts for connecting the plurality of second lower lines to the third lower line, wherein a second lower line, among the plurality of second lower lines, is electrically connected to a lower bonding pad, among the plurality of lower bonding pads, and wherein an output terminal of the defect detection circuit is connected to another second lower line, among the plurality of second lower lines.

* * * * *